(12) United States Patent
Misaki

(10) Patent No.: US 9,246,010 B2
(45) Date of Patent: Jan. 26, 2016

(54) THIN FILM TRANSISTOR SUBSTRATE

(75) Inventor: Katsunori Misaki, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 132 days.

(21) Appl. No.: 13/698,750

(22) PCT Filed: May 24, 2011

(86) PCT No.: PCT/JP2011/002881
§ 371 (c)(1),
(2), (4) Date: Nov. 19, 2012

(87) PCT Pub. No.: WO2012/008080
PCT Pub. Date: Jan. 19, 2012

(65) Prior Publication Data
US 2013/0063675 A1 Mar. 14, 2013

(30) Foreign Application Priority Data
Jul. 14, 2010 (JP) ................. 2010-159529

(51) Int. Cl.
*H01L 29/786* (2006.01)
*G02F 1/1368* (2006.01)
*H01L 27/12* (2006.01)
*G02F 1/1345* (2006.01)
*G02F 1/1362* (2006.01)

(52) U.S. Cl.
CPC .......... *H01L 29/7869* (2013.01); *G02F 1/1368* (2013.01); *H01L 27/1225* (2013.01); *G02F 1/13458* (2013.01); *G02F 1/136227* (2013.01)

(58) Field of Classification Search
CPC ............ H01L 27/1225; H01L 29/7869; H01L 29/78696
See application file for complete search history.

(56) References Cited

U.S. PATENT DOCUMENTS

| 7,977,675 B2 * | 7/2011 | Kawamura et al. | 257/43 |
| 2008/0038882 A1 * | 2/2008 | Takechi et al. | 438/151 |
| 2008/0296568 A1 * | 12/2008 | Ryu et al. | 257/43 |
| 2009/0261325 A1 * | 10/2009 | Kawamura et al. | 257/43 |
| 2009/0321731 A1 * | 12/2009 | Jeong et al. | 257/43 |
| 2010/0026169 A1 * | 2/2010 | Jeong et al. | 313/504 |
| 2010/0051933 A1 * | 3/2010 | Kim et al. | 257/43 |

(Continued)

FOREIGN PATENT DOCUMENTS

| JP | 2009-295997 A | 12/2009 |
| JP | 2010-040552 A | 2/2010 |
| JP | 2010-153842 A | 7/2010 |

OTHER PUBLICATIONS

Official Communication issued in International Patent Application No. PCT/JP2011/002881, mailed on Jul. 12, 2011.

*Primary Examiner* — Jerome Jackson, Jr.
(74) *Attorney, Agent, or Firm* — Keating & Bennett, LLP

(57) ABSTRACT

In an oxide semiconductor layer, a degree of oxidation S1 of a portion located on the side of the gate insulating film, and a degree of oxidation S2 of surface layer portions located in connection regions with source and drain electrodes have a relation of S2<S1 within a range in which the oxide semiconductor layer has predetermined electric resistance, and a degree of oxidation S3 of a surface layer portion of the channel region is made higher than the degrees of oxidation S1, S2 of the other regions within the range in which the oxide semiconductor layer has the predetermined electric resistance, by annealing the oxide semiconductor layer in an oxygen-containing atmosphere after formation of the source electrode and the drain electrode.

10 Claims, 30 Drawing Sheets

(56) References Cited

U.S. PATENT DOCUMENTS

| | | |
|---|---|---|
| 2010/0109003 A1* | 5/2010 | Akimoto et al. ................ 257/43 |
| 2010/0133530 A1 | 6/2010 | Akimoto et al. |
| 2010/0163867 A1* | 7/2010 | Yamazaki et al. ............. 257/43 |
| 2010/0181565 A1* | 7/2010 | Sakata et al. ................... 257/43 |
| 2010/0200843 A1* | 8/2010 | Arai et al. ...................... 257/40 |
| 2010/0224873 A1* | 9/2010 | Sakata et al. ................... 257/43 |
| 2011/0095288 A1* | 4/2011 | Morosawa et al. ............. 257/43 |
| 2012/0326144 A1* | 12/2012 | Ohta et al. ...................... 257/43 |

* cited by examiner

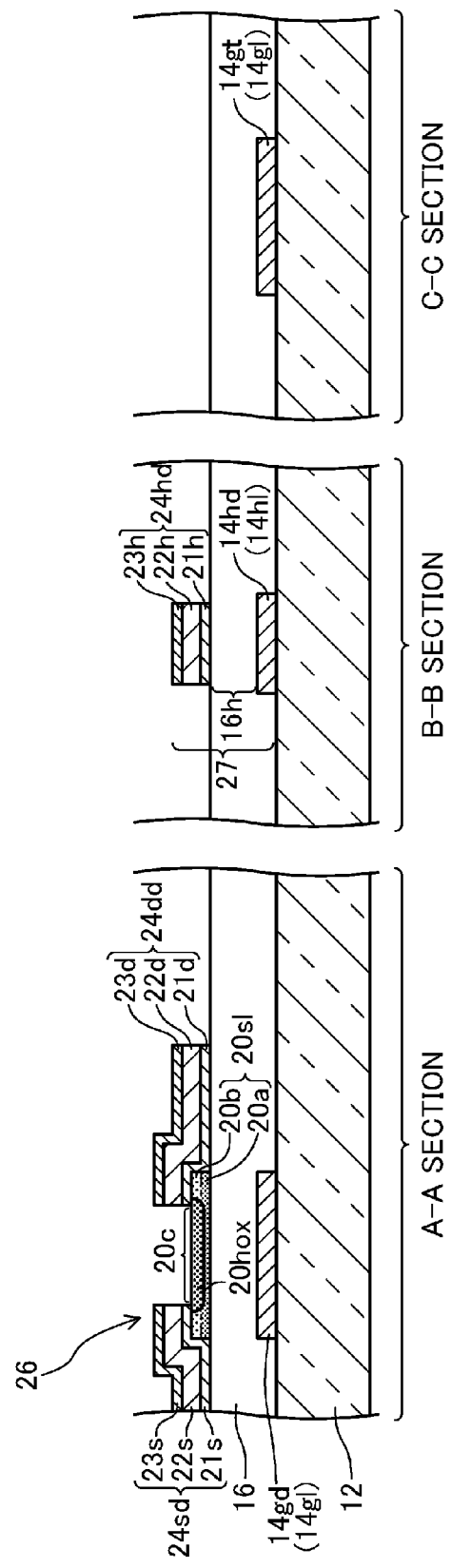

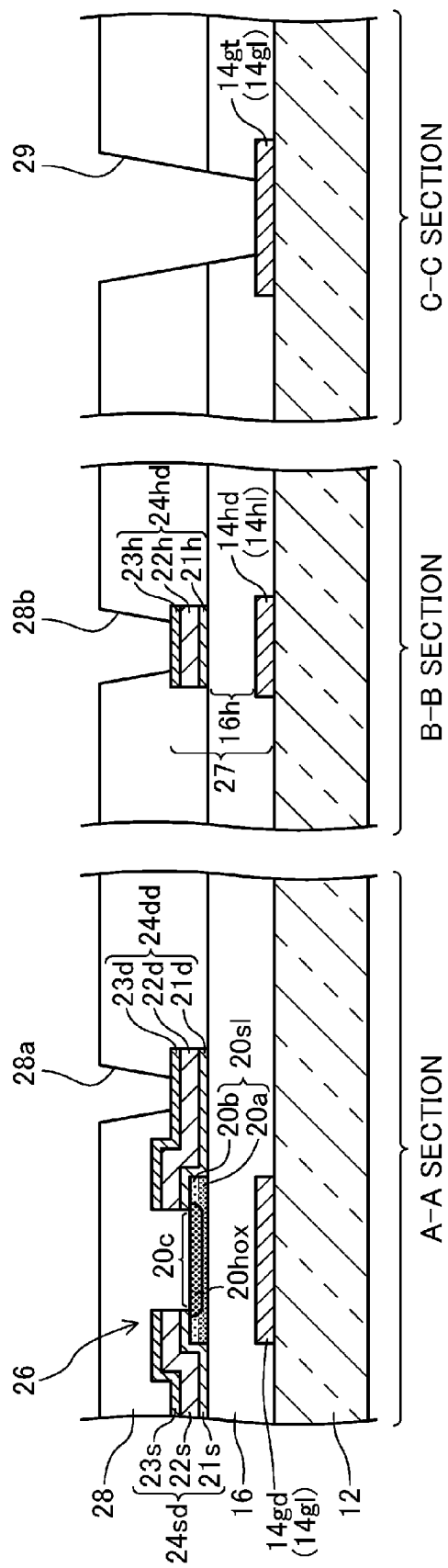

THIN FILM TRANSISTOR SUBSTRATE

TECHNICAL FIELD

The present invention relates to thin film transistor (TFT) substrates, liquid crystal display (LCD) devices including the same, and methods for manufacturing the TFT substrate, and more particularly to TFT substrates having TFTs using a semiconductor layer comprised of an oxide semiconductor, LCD devices, and methods for manufacturing the TFT substrate.

BACKGROUND ART

In recent years, in TFT substrates forming LCD devices, TFTs using a semiconductor layer comprised of an oxide semiconductor (hereinafter referred to as the "oxide semiconductor layer") and having satisfactory characteristics such as high mobility, high reliability, and a low off-state current have been proposed as switching elements of pixels as a minimum unit of an image, instead of conventional TFTs using a semiconductor layer comprised of amorphous silicon (a-Si).

A typical TFT with a bottom gate structure includes a gate electrode formed on, e.g., a glass substrate, a gate insulating film provided so as to cover the gate electrode, a semiconductor layer provided on the gate insulating film so as to overlap the gate electrode, and source and drain electrodes provided on the gate insulating film so as to partially overlap the semiconductor layer with a gap between the source and drain electrodes, and a channel region is formed in a portion of the semiconductor layer which is exposed between the source and drain electrodes. A TFT using an oxide semiconductor layer also has a similar structure. In a TFT substrate, the TFT is covered by a protective insulating film, and a pixel electrode formed on the protective insulating film is connected to the drain electrode via a contact hole formed in the protective insulating film.

Such a TFT substrate having a TFT with a bottom gate structure can be manufactured by repeating a series of steps of sequentially forming an etching film by a sputtering method, a chemical vapor deposition (CVD) method, etc. and a photosensitive resin film by a coating method on, e.g., a glass substrate, exposing the photosensitive resin film via a photomask and then developing the photosensitive resin film to form a resist pattern, and patterning the etching film exposed from the resist pattern by dry etching or wet etching.

A channel etch TFT is known as such a TFT with a bottom gate structure. The number of photomasks required to form the channel etch TFT is smaller than that required to form an etch stopper TFT that includes a channel protective film functioning as an etch stopper, because the channel etch TFT does not have the channel protective film. Accordingly, the channel etch TFT is advantageous in terms of manufacturing cost. A channel etch TFT is also disclosed in, e.g., Patent Document 1 as a TFT using an oxide semiconductor layer.

Patent Document 1 discloses a configuration that uses an oxide semiconductor layer having a region where specific resistance varies in the thickness direction. In this configuration, the oxide semiconductor layer has lower specific resistance on the side of a gate insulating film than on the side of source and drain electrodes. Patent Document 1 describes that a TFT having stable characteristics such as a threshold voltage can be obtained by this configuration.

CITATION LIST

Patent Document

PATENT DOCUMENT 1: Japanese Patent Publication No. 2010-40552

SUMMARY OF THE INVENTION

Technical Problem

The oxide semiconductor layer easily dissolves in an acid etchant that is commonly used to wet etching the source and drain electrodes. Accordingly, in the channel etch TFT using the oxide semiconductor layer, the source and drain electrodes are patterned by dry etching.

In this case, however, since a channel region of the oxide semiconductor layer, which is exposed from the source and drain electrodes, is exposed to plasma, the channel region is subjected to plasma damage due to elimination of oxygen from the oxide semiconductor layer by plasma heat, etc. This tends to cause oxygen deficiency in a surface layer portion of the channel region.

When forming a protective insulating film by a CVD method, the oxide semiconductor layer is annealed in a vacuum atmosphere by heat associated with the process of forming the protective insulating film. This also tends to cause oxygen deficiency in the oxide semiconductor layer due to elimination of oxygen from the oxide semiconductor layer.

As described above, oxygen deficiency tends to occur in the oxide semiconductor layer of the channel etch TFT in a manufacturing process of the TFT substrate. In particular, due to plasma damage that is caused when forming the source and drain electrodes, oxygen deficiency tends to occur intensively in the surface layer portion of the channel region as compared to the remaining region of the oxide semiconductor layer. This alters the oxide semiconductor layer and reduces electric resistance thereof, thereby causing problems such as an increased threshold voltage, an increased off-state current, hysteresis, etc., and thus degrading TFT characteristics. This makes it difficult to stably form TFTs having satisfactory characteristics in a TFT substrate including channel etch TFTs using an oxide semiconductor layer.

One method to suppress alteration of the oxide semiconductor layer is to compensate for the oxygen deficiency by using as the oxide semiconductor layer a high oxide film having a high degree of oxidation. However, the higher the degree of oxidation of the oxide semiconductor layer is, the higher the specific resistance of the oxide semiconductor layer is. Accordingly, in particular, if the degree of oxidation of the oxide semiconductor layer is designed according to the surface layer portion of the channel region where oxidation deficiency occurs intensively, electric resistance between the source and drain electrodes becomes excessively high, whereby the mobility and on-state current of the TFT are reduced.

Since the TFT of Patent Document 1 is also not configured according to the distribution of oxygen deficiency in the oxide semiconductor layer, an increased threshold voltage etc. tends to be caused by the oxygen deficiency. Moreover, the oxide semiconductor layer has high resistance in the surface layer portions located in the connection regions with the source and drain electrodes. This causes problems such as reduced mobility, a reduced on-state current, etc. due to the high contact resistance between the oxide semiconductor layer and the source and drain electrodes, making it difficult to ensure satisfactory characteristics.

The present invention was developed in view of the above problems, and it is an object of the present invention to stably ensure satisfactory characteristics of channel etch TFTs using an oxide semiconductor layer.

Solution to the Problem

In order to achieve the above object, according to the present invention, the composition of an oxide semiconductor layer is designed so that the degree of oxidation of the oxide semiconductor layer is low in surface layer potions located in connection regions with the source and drain electrodes, and that in the remaining region including a channel region, the degree of oxidation of the oxide semiconductor layer increases according to distribution of oxygen deficiency that occurs in an oxide semiconductor layer having a conventional composition.

Specifically, the present invention is directed to: a TFT substrate including a base substrate, a plurality of TFTs provided on the base substrate, a protective insulating film provided so as to cover the TFTs, a plurality of pixel electrodes provided on the protective insulating film so as to correspond to the TFTs, respectively, wherein each of the TFTs has a gate electrode, a gate insulating film provided so as to cover the gate electrode, an oxide semiconductor layer provided on the gate insulating film so as to overlap the gate electrode, and a source electrode and a drain electrode which are provided on the gate insulating film so as to be separated from each other on the oxide semiconductor layer and so that a part of the source electrode and a part of the drain electrode are connected to the oxide semiconductor layer, and a channel region is formed in a portion of the oxide semiconductor layer which is located between the source electrode and the drain electrode; an LCD device including the TFT substrate; and a manufacturing method of the TFT substrate, and takes the following measures to solve the problems.

In other words, according to a first invention, in the oxide semiconductor layer of the TFT substrate, a degree of oxidation $S1$ of a portion located on a side of the gate insulating film and a degree of oxidation $S2$ of surface layer portions located in connection regions with the source and drain electrodes have a relation of $S2<S1$ within a range in which the oxide semiconductor layer has predetermined electric resistance, and a degree of oxidation $S3$ of a surface layer portion of the channel region is made higher than the degrees of oxidation $S1$, $S2$ of the other regions within the range in which the oxide semiconductor layer has the predetermined electric resistance, by annealing the oxide semiconductor layer in an oxygen-containing atmosphere after formation of the source electrode and the drain electrode.

With the above configuration, in the oxide semiconductor layer, the degree of oxidation $S1$ of the portion located on the side of the gate insulating film and the degree of oxidation $S2$ of the surface layer portions located in the connection regions with the source and drain electrodes have the relation of $S2<S1$. Thus, in the surface layer portions located in the connection regions with the source and drain electrodes, the electric resistance of the oxide semiconductor layer is reduced according to the degree of oxidation $S2$. This reduces contact resistance between the oxide semiconductor layer and the source electrode and between the oxide semiconductor layer and the drain electrode, whereby the mobility and on-state current of the TFT can be increased. Even if the source and drain electrodes are formed by dry etching, and the protective insulating film is formed by a vapor deposition method such as a CVD method, oxygen deficiency is compensated for and alteration is suppressed in the portion of the oxide semiconductor layer which is located on the side of the gate insulating film. Thus, higher electric resistance according to the degree of oxidation $S1$ is ensured in the portion of the oxide semiconductor layer which is located on the side of the gate insulating film than in the surface layer portions of the oxide semiconductor layer which are located in the connection regions with the source and drain electrodes. In the oxide semiconductor layer, oxygen deficiency tends to occur particularly in the surface layer portion of the channel region. Since the degree of oxidation $S3$ of this surface layer portion of the channel region is made higher than the degrees of oxidation $S1$, $S2$ of the other regions by annealing the oxide semiconductor layer in an oxygen-containing atmosphere after formation of the source and drain electrodes, higher electric resistance according to the degree of oxidation $S3$ can be ensured in this surface layer portion of the channel region than in the other regions. This can stabilize the threshold voltage of the TFT. Thus, the threshold voltage is stabilized while increasing the mobility and on-state current in the channel etch TFT using the oxide semiconductor layer, whereby satisfactory characteristics can be stably ensured.

According to a second invention, in the TFT substrate of the first invention, the oxide semiconductor layer has a stacked structure formed by stacking a plurality of layers.

With this configuration, since the oxide semiconductor layer has a stacked structure, an oxidation reaction caused by the annealing is suppressed at the interface between adjoining layers of the oxide semiconductor layer. This prevents the oxidation reaction from proceeding all the way to the interface of the channel region with the gate insulating film along the entire thickness of the oxide semiconductor layer, and thus suppresses an excessive increase in electric resistance between the source electrode and the drain electrode according to the electric resistance of the channel region. This can stably ensure satisfactory mobility and on-state current of the TFT.

According to a third invention, in the TFT substrate of the second invention, the oxide semiconductor layer has a two-layer structure formed by sequentially stacking a first semiconductor layer and a second semiconductor layer, and in the oxide semiconductor layer, the portion located on the side of the gate insulating film corresponds to the first semiconductor layer, the surface layer portions located in the connection regions with the source and drain electrodes correspond to portions of the second semiconductor layer which are located in the connection regions with the source and drain electrodes, and the surface layer portion of the channel region corresponds to a channel region portion of the second semiconductor layer.

With the above configuration, the advantages of the first invention are specifically obtained. Moreover, since the oxidation reaction caused by the annealing is suppressed at the interface between the first and second semiconductor layers, the oxidation reaction is specifically prevented from proceeding all the way to the interface of the channel region with the gate insulating film along the entire thickness of the oxide semiconductor layer.

According to a fourth invention, in the TFT substrate of the second invention, the oxide semiconductor layer has a three-layer structure formed by sequentially stacking a first semiconductor layer, a second semiconductor layer, and a third semiconductor layer, and in the oxide semiconductor layer, the portion located on the side of the gate insulating film corresponds to the first semiconductor layer, the surface layer portions located in the connection regions with the source and drain electrodes correspond to portions of the second semiconductor layer and the third semiconductor layer which are located in the connection regions with the source and drain electrodes, and the surface layer portion of the channel region corresponds to channel region portions of the second semiconductor layer and the third semiconductor layer.

With the above configuration, the advantages of the first invention are specifically obtained. Moreover, since the oxidation reaction caused by the annealing is suppressed at the interface between the second and third semiconductor layers and as necessary at the interface between the first and second semiconductor layers, the oxidation reaction is further prevented from proceeding all the way to the interface of the channel region with the gate insulating film along the entire thickness of the oxide semiconductor layer.

According to a fifth invention, in the TFT substrate of the first invention, the semiconductor layer is formed by a single layer, and in the semiconductor layer except the surface layer portion of the channel region, the degree of oxidation decreases from the side of the gate insulating film to a side of the source electrode and the drain electrode.

With this configuration as well, the advantages of the present invention are specifically obtained.

According to a sixth invention, in the TFT substrate of any one of the first to fifth inventions, at least a surface layer portion of the gate insulating film is comprised of silicon oxide.

The above configuration suppresses occurrence of oxygen deficiency in the oxide semiconductor layer due to hydrogen elimination in the film, which may occur in the case where the surface layer portion of the gate insulating film is comprised of, e.g., silicon nitride.

According to a seventh invention, in the TFT substrate of any one of the first to sixth inventions, the protective insulating film is comprised of silicon oxide.

With the above configuration, forming the protective insulating film comprised of silicon oxide suppresses occurrence of oxygen deficiency in the oxide semiconductor layer due to hydrogen elimination in the film, which may occur in the case where the protective insulating film is comprised of, e.g., silicon nitride. The protective insulating film comprised of silicon oxide typically has a higher oxygen transmission rate than, e.g., a silicon nitride film. Thus, in the case where annealing is performed in an oxygen-containing atmosphere after formation of the protective insulating film, oxygen of the annealing is effectively supplied to the channel region of the oxide semiconductor layer.

In an eighth invention, in the TFT substrate of any one of the first to seventh inventions, the oxide semiconductor layer is comprised of an indium gallium zinc oxide (In—Ga—Zn—O)-based oxide semiconductor.

With the above configuration, satisfactory characteristics such as high mobility, high reliability, and a low off-state current are specifically ensured in the TFT.

According to a ninth invention, an LCD device includes: the thin film transistor substrate of any one of the first to eighth inventions; a counter substrate placed so as to face the thin film transistor substrate; and a liquid crystal layer provided between the thin film transistor substrate and the counter substrate.

With the above configuration, the TFT substrates of the first to eighth inventions have excellent characteristics ensuring satisfactory characteristics in the channel etch TFT using the oxide semiconductor layer. Thus, display quality can be improved while reducing manufacturing cost of the LCD device.

According to a tenth invention, a method for manufacturing the TFT substrate of the first invention includes: a first patterning step of forming the gate electrode by forming a conductive film on the base substrate and patterning the conductive film by using a first photomask; a gate insulating film formation step of forming the gate insulating film so as to cover the gate electrode; a second patterning step of forming the semiconductor layer of the TFT by forming on the gate insulating film a semiconductor film comprised of an oxide semiconductor so that the degree of oxidation S1 of the portion located on the side of the gate insulating film and the degree of oxidation S2 of the surface layer portions have the relation of S2<S1, and patterning the semiconductor film by using a second photomask; a third patterning step of forming the source electrode and the drain electrode by forming a conductive film so as to cover the oxide semiconductor layer and patterning the conductive film by dry etching using a third photomask; a fourth patterning step of forming a contact hole in a region corresponding to the drain electrode by forming a protective insulating film by a vapor deposition method so as to cover the source electrode and the drain electrode and patterning the protective insulating film by using a fourth photomask; and a fifth patterning step of forming the pixel electrode so as to connect to the drain electrode, by forming on the protective insulating film a conductive film so as to connect to the drain electrode via the contact hole, and patterning the conductive film by using a fifth photomask, wherein in the oxide semiconductor layer, the degree of oxidation S3 of the surface layer portion of the channel region is made higher than the degrees of oxidation S1, S2 of the other regions by annealing the substrate having both the source electrode and the drain electrode formed thereon in an oxygen-containing atmosphere after the third patterning step.

In the above manufacturing method, the oxide semiconductor layer is formed in the second patterning step so that the degree of oxidation S1 of the portion located on the side of the gate insulating film and the degree of oxidation S2 of the surface layer portions have the relation of S2<S1. Thus, in the surface layer portions located in the connection regions with the source and drain electrodes, the electric resistance of the oxide semiconductor layer is reduced according to the degree of oxidation S2. This reduces contact resistance between the oxide semiconductor layer and the source electrode and between the oxide semiconductor layer and the drain electrode, whereby the mobility and on-state current of the TFT are increased. Even if the source and drain electrodes are formed by dry etching, and the protective insulating film is formed by a vapor deposition method, oxygen deficiency is compensated for and alteration is suppressed in the portion of the oxide semiconductor layer which is located on the side of the gate insulating film. Thus, higher electric resistance according to the degree of oxidation S1 is ensured in the portion of the oxide semiconductor layer which is located on the side of the gate insulating film than in the surface layer portions of the oxide semiconductor layer which are located in the connection regions with the source and drain electrodes. In the oxide semiconductor layer, oxygen deficiency tends to occur particularly in the surface layer portion of the channel region. Since the degree of oxidation S3 of this surface layer portion of the channel region is made higher than the degrees of oxidation S1, S2 of the other regions by annealing the substrate having both the source and drain electrodes formed thereon in an oxygen-containing atmosphere, higher electric resistance according to the degree of oxidation S3 is ensured in this surface layer portion of the channel region than in the other regions. This stabilizes the threshold voltage of the TFT. Thus, the threshold voltage is stabilized while increasing the mobility and on-state current in the channel etch TFT using the oxide semiconductor layer, whereby satisfactory characteristics are stably ensured.

The TFT substrate is manufactured by using a total of five photomasks. Thus, the number of photomasks required to manufacture this TFT substrate is smaller than that required to manufacture a TFT substrate having an etch stopper TFT, because the former TFT substrate does not have a channel protective film functioning as an etch stopper. This suppresses manufacturing cost.

Advantages of the Invention

According to the present invention, the oxide semiconductor layer is configured so that the degree of oxidation of the oxide semiconductor layer is low in the surface layer potions located in the connection regions with the source and drain electrodes, and in the remaining region including the channel region, the degree of oxidation of the oxide semiconductor layer increases according to distribution of oxygen deficiency that occurs in an oxide semiconductor layer having a conventional composition. This can stabilize the threshold voltage while increasing the mobility and the on-state current in the channel etch TFT using the oxide semiconductor layer, and can ensure satisfactory TFT characteristics. If this TFT substrate is applied to display devices, display quality can be improved while reducing manufacturing cost of the display devices.

BRIEF DESCRIPTION OF THE DRAWINGS

FIG. 29 is a cross-sectional view corresponding to FIG. 24, showing the state where the oxide semiconductor layer has been annealed in the manufacturing method of the TFT substrate according to the fourth embodiment.

FIG. 30 is a cross-sectional view corresponding to FIG. 24, showing the state where a protective insulating film has been formed in a fourth patterning step in the manufacturing method of the TFT substrate according to the fourth embodiment.

DESCRIPTION OF EMBODIMENTS

Embodiments of the present invention will be described in detail below with reference to the accompanying drawings. The present invention is not limited to the following embodiments.

First Embodiment of Invention

Figure 1:
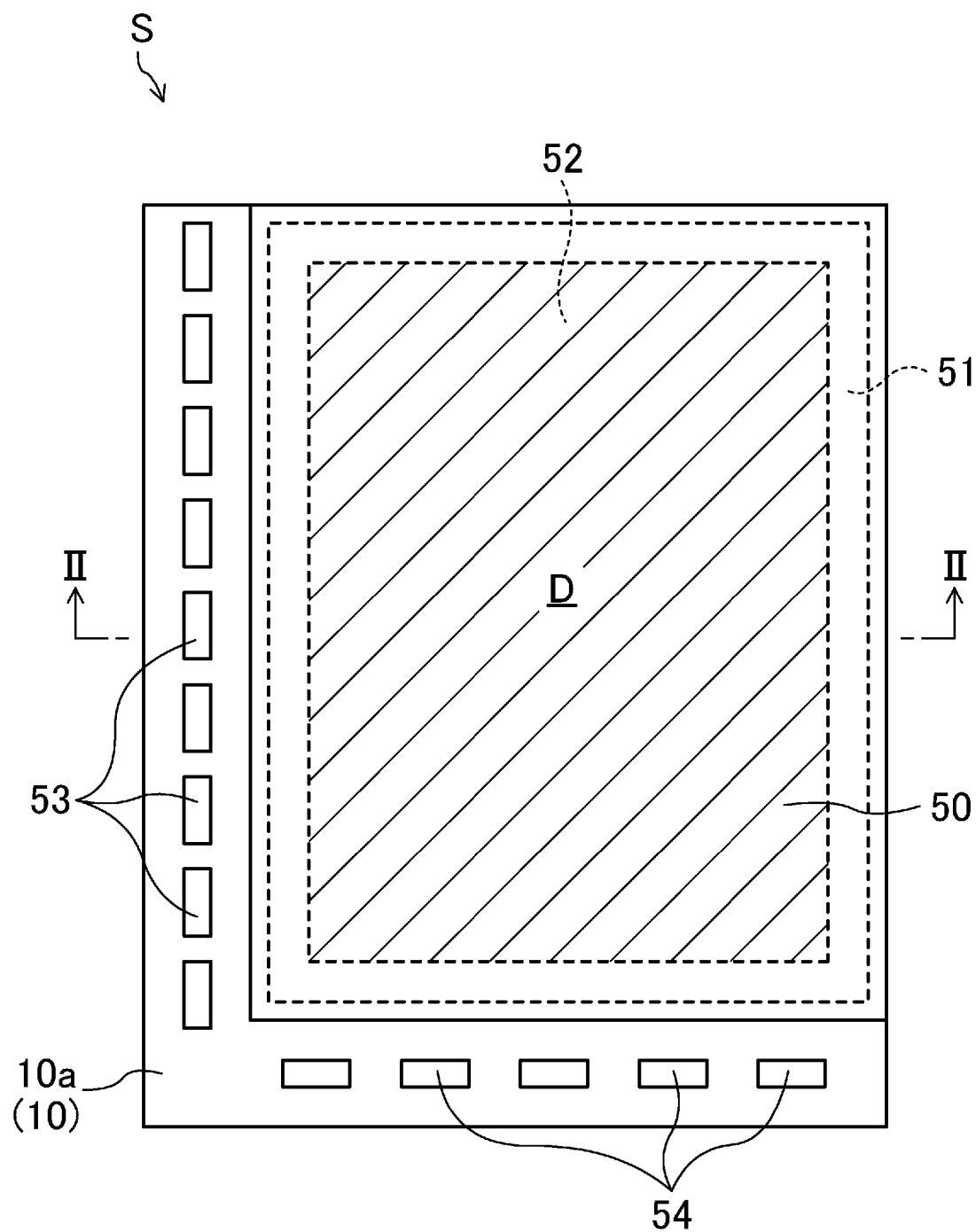
FIG. 1 is a plan view schematically showing an LCD device according to a first embodiment.
Figure 2:
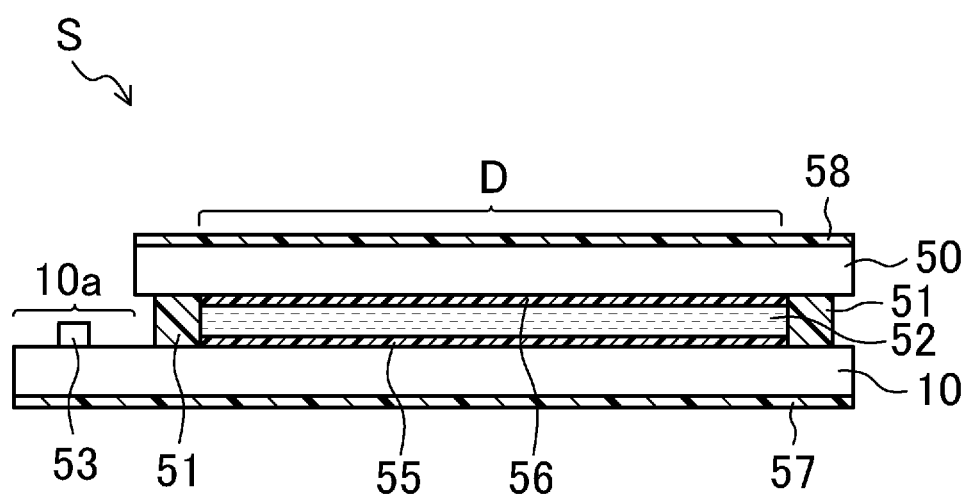
FIG. 2 is a cross-sectional view showing a cross-sectional structure taken along line II-II in FIG. 1.

FIG. 1 is a schematic plan view of an LCD device S according to a first embodiment. FIG. 2 is a schematic cross-sectional view showing a cross-sectional structure taken along line II-II in FIG. 1. A polarizer 58 shown in FIG. 2 is not shown in FIG. 1.

(Configuration of LCD Device S)

The LCD device S includes: a TFT substrate 10 and a counter substrate 50 which are placed so as to face each other; a frame-shaped sealant 51 that bonds outer peripheral edges of the TFT substrate 10 and the counter substrate 10; and a liquid crystal layer 52 enclosed between the TFT substrate 10 and the counter substrate 50 by the sealant 51.

This LCD device S is a transmissive LCD device, and a display region D configured to display an image is defined inside the sealant 51 in a region where the TFT substrate 10 overlaps the counter substrate 50, namely in a region where the liquid crystal layer 52 is provided. In a region outside the display region D, the TFT substrate 10 protrudes in, e.g., an L-shape etc. beyond the counter substrate 50, forming a terminal region 10a.

The display region D is, e.g., a rectangular region, in which a plurality of pixels as a minimum unit of an image are arranged in a matrix pattern. On the other hand, a plurality of gate driver integrated circuits (IC) chips 53 are mounted on one side (the left side in FIG. 1) of the terminal region 10a with anisotropic conductive films (ACFs) interposed therebetween. A plurality of source driver IC chips 54 are mounted on another side (the lower side in FIG. 1) of the terminal region 10a with ACFs interposed therebetween.

Each of the TFT substrate 10 and the counter substrate 50 is formed in, e.g., a rectangular shape. As shown in FIG. 2, alignment films 55, 56 are respectively provided on the opposing inner surfaces of the TFT substrate 10 and the counter substrate 50, and polarizers 57, 58 are respectively provided on the outer surfaces of the TFT substrate 10 and the counter substrate 50. The liquid crystal layer 52 is comprised of a nematic liquid crystal material having electrooptical characteristics, etc.

(Configuration of TFT Substrate 10)

Figure 3:
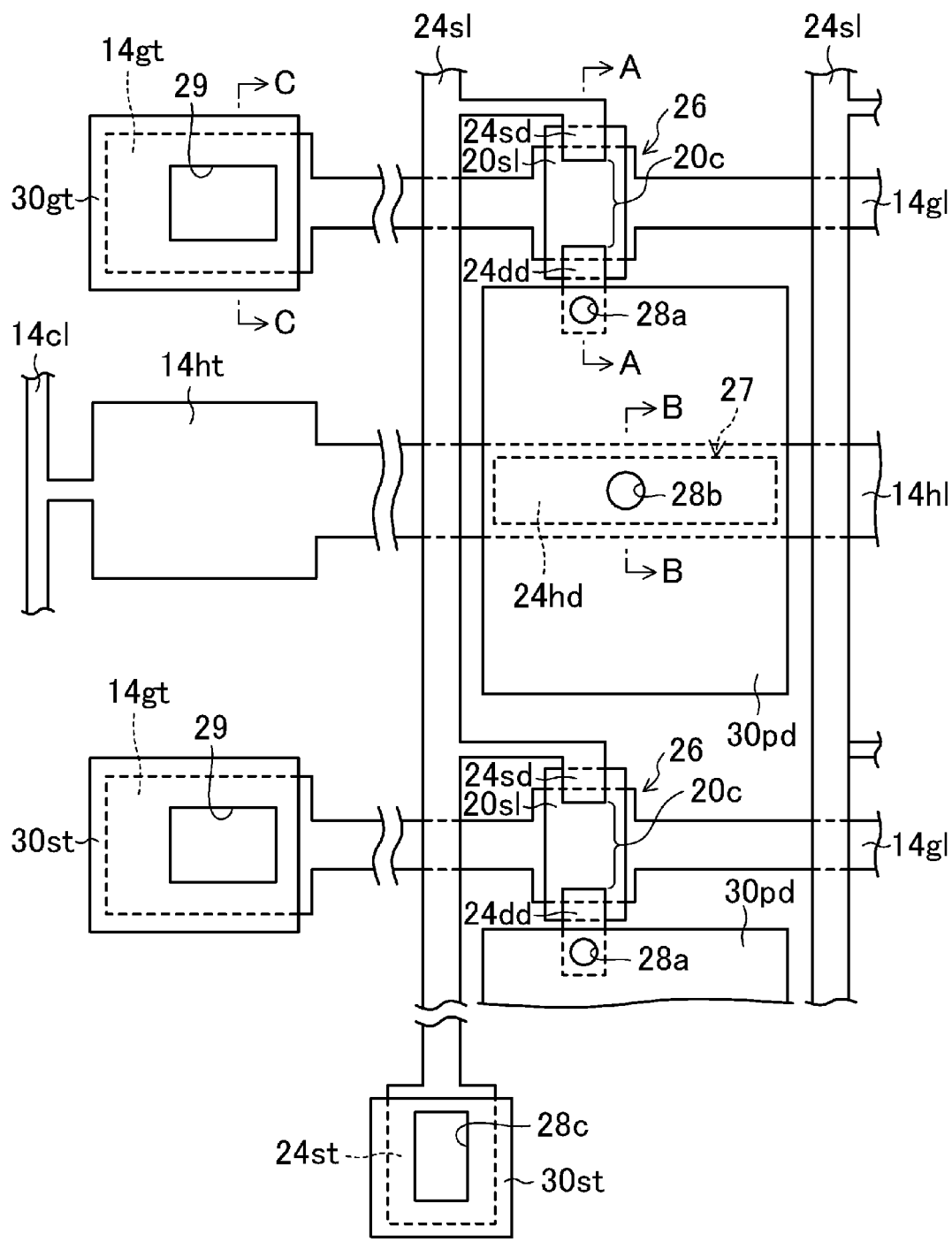
FIG. 3 is a plan view schematically showing a configuration of a pixel and terminal portions of interconnects in a TFT substrate according to the first embodiment.
Figure 4:
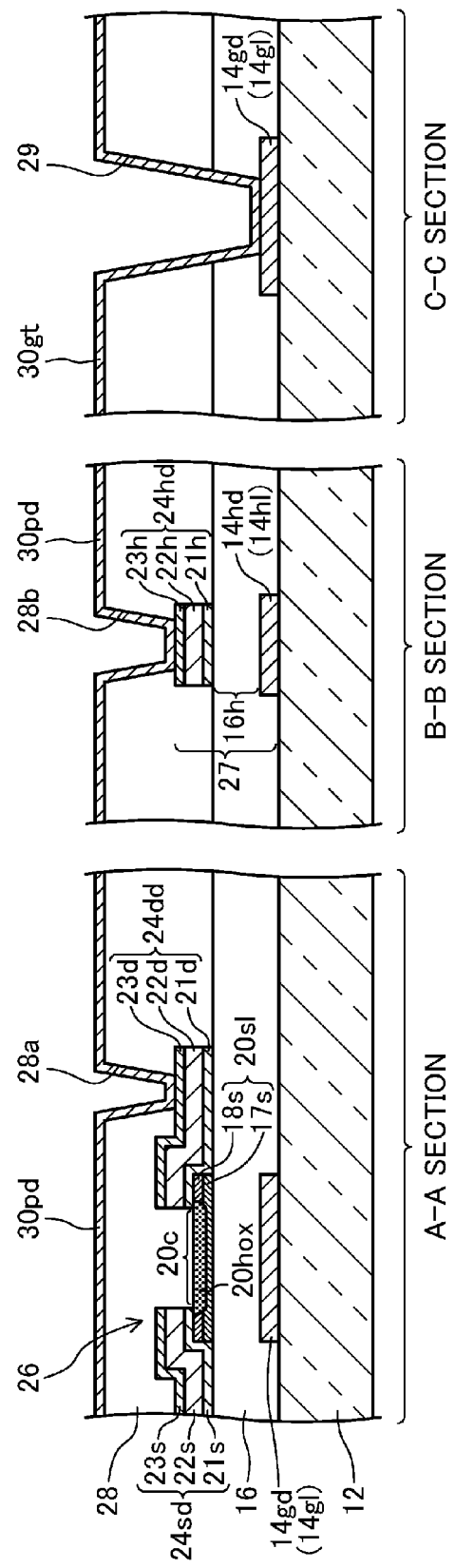
FIG. 4 is a cross-sectional view showing cross-sectional structures taken along lines A-A, B-B, and C-C in FIG. 3.

FIGS. 3 and 4 show schematic configuration diagrams of the TFT substrate 10. FIG. 3 is a plan view showing a pixel and terminal portions of interconnects. FIG. 4 is a cross-sectional view showing cross-sectional structures taken along lines A-A, B-B, and C-C in FIG. 3 in this order from left to right in the figure.

The TFT substrate 10 has an insulating substrate 12 such as a glass substrate as a base substrate shown in FIG. 4. As shown in FIG. 3, in the display region D, the TFT substrate 10 includes, on the insulating substrate 12, a plurality of gate lines 14gl provided so as to extend parallel to each other, a plurality of storage capacitor lines 14hl provided for every gate line 14gl and each extending along a corresponding one of the gate lines 14gl, and a plurality of source lines 24sl provided so as to extend parallel to each other in a direction crossing the gate lines 14gl and the storage capacitor lines 14hl with an insulating film interposed therebetween. The gate lines 14gl and the source lines 24sl are generally arranged in a grid pattern so as to define each pixel. Each storage capacitor line 14hl extends across those pixels arranged in the direction in which the gate lines 14gl extend.

The TFT substrate 10 further includes a TFT 26, a storage capacitor 27, and a pixel electrode 30pd at every intersection of the gate line 14gl and the source line 24sl, namely in every pixel.

Each TFT 26 is a channel etch TFT having a bottom gate structure, and as shown in FIG. 4 (A-A section), includes: a gate electrode 14gd provided on the surface of the insulating substrate 12; a gate insulating film 16 provided so as to cover the gate electrode 14gd; an oxide semiconductor layer 20sl provided on the gate insulating film 16 so as to overlap the gate electrode 14gd; and a source electrode 24sd and a drain electrode 24dd which are provided on the gate insulating film 16 so that a part of the source electrode 24sd and a part of the drain electrode 24dd are connected to the oxide semiconductor layer 20sl and so that the source electrode 24sd and the drain electrode 24dd are separated from each other on the oxide semiconductor layer 20sl. A channel region 20c is formed in a part of the oxide semiconductor layer 20sl which is located between the source electrode 24sd and the drain electrode 24dd.

The gate electrode 14gd is a part of the gate line 14gl which forms a corresponding one of the intersections. As shown in FIG. 3, the gate electrode 14gd has a protruding portion protruding on both sides in the lateral direction of the gate line 14gl, and the channel length of the TFT 26 is adjusted by the protruding width of the protruding portion. Although not shown in the figures, the gate electrode 14gd and the gate line 14gl are comprised of a stack of, e.g., an aluminum (Al) layer, a titanium (Ti) layer, and a titanium nitride (TiN) layer, which are sequentially stacked in this order.

The gate insulating film 16 is comprised of, e.g., silicon oxide (SiO). This suppresses occurrence of oxygen deficiency in the oxide semiconductor layer 20sl due to hydrogen elimination in the film, which may occur in the case where the gate insulating film 16 is comprised of, e.g., a silicon nitride (SiN) film. In order to suppress oxygen deficiency in the oxide semiconductor layer 20sl due to hydrogen elimination in the gate insulating film 16, the gate insulating film 16 may be formed by sequentially stacking, e.g., a silicon nitride film and a silicon oxide film, and may be comprised of any material as long as at least a surface layer portion of the gate insulating film 16 is comprised of silicon oxide.

The oxide semiconductor layer 20sl is comprised of an In—Ga—Zn—O-based oxide semiconductor. Thus, the TFT 26 has satisfactory characteristics such as high mobility, high reliability, and a low off-state current. In the oxide semiconductor layer 20sl, a degree of oxidation S1 of a portion located on the side of the gate insulating film 16 and a degree of oxidation S2 of surface layer portions located in the connection regions with the source electrode 24sd and the drain electrode 24dd have a relation of S2<S1 within a range in which the oxide semiconductor layer 20sl has electric resistance, and a degree of oxidation S3 of a surface layer portion of the channel region 20c is higher than the degrees of oxidation S1, S2 of the other regions within the range in which the oxide semiconductor layer 20sl has the electric resistance. As used herein, the term "degree of oxidation" refers to the ratio of oxygen to all metal elements in the oxide semiconductor layer 20sl. The degree of oxidation can be measured by, e.g., X-ray fluorescence analysis (XRF). For example, an X-ray fluorescence spectrometer can be used for the measurement.

Specifically, in the present embodiment, the oxide semiconductor layer 20sl has a two-layer structure formed by sequentially stacking a first semiconductor layer 17s comprised of an In—Ga—Zn—O-based oxide semiconductor having a high degree of oxidation, and a second semiconductor layer 18s comprised of an In—Ga—Zn—O-based oxide semiconductor having a lower degree of oxidation than the first semiconductor layer 17s. A high oxide region 20hox having a higher degree of oxidation than the first semiconductor layer 17s is formed in a channel region portion of the second semiconductor layer 18s. As described in detail below, the high oxide region 20hox is formed by annealing the oxide semiconductor layer 20sl in an oxygen-containing atmosphere after formation of the source electrode 24sd and the drain electrode 24dd. The high oxide region 20hox slightly extends in the connection regions with the source electrode 24sd and the drain electrode 24dd in the second semiconductor layer 18s, and in the first semiconductor layer 17s. In the oxide semiconductor layer 20sl, the portion located on the side of the gate insulating film 16 corresponds to the first semiconductor layer 17s, the surface layer portions located in the connection regions with the source electrode 24sd and the drain electrode 24dd correspond to the portions of the second semiconductor layer 18s which are located in the connection regions with the source electrode 24sd and the drain electrode 24dd, and the surface layer portion of the channel region 20c corresponds to the channel region portion of the second semiconductor layer 18s (the high oxide region 20hox).

As described above, the degree of oxidation S1 of the first semiconductor layer 17s, the degree of oxidation S2 of the portions of the second semiconductor layer 18s which are located in the connection regions with the source electrode 24sd and the drain electrode 24dd, and the degree of oxidation S3 of the high oxide region 20hox have a relation of S2<S1<S3. This can stabilize the threshold voltage while increasing the mobility and on-state current of the TFT 26.

In other words, in the oxide semiconductor layer 20sl, the degree of oxidation S1 of the first semiconductor layer 17s and the degree of oxidation S2 of the second semiconductor layer 18s in the connection regions with the source electrode 24sd and the drain electrode 24dd have a relation of S2<S1. Accordingly, in the surface layer portions of the oxide semiconductor layer 20sl which are located in the connection regions with the source electrode 24sd and the drain electrode 24dd, the electric resistance can be reduced according to the degree of oxidation S2. This reduces the contact resistance between the oxide semiconductor layer 20sl and the source electrode 24sd and between the oxide semiconductor layer 20sl and the drain electrode 24dd, whereby the mobility and on-state current of the TFT 26 can be increased. Even if the source and drain electrodes are formed by dry etching, and a protective insulating film is formed by a vapor deposition method such as a CVD method, oxygen deficiency is compensated for and alteration is suppressed in the portion of the oxide semiconductor layer 20sl which is located on the side of the gate insulating film 16. Thus, higher electric resistance according to the degree of oxidation S1 can be ensured in the portion of the oxide semiconductor layer 20sl which is located on the side of the gate insulating film 16 than in the portions of the second semiconductor layer 18s which are located in the connection regions with the source and drain electrodes. In the oxide semiconductor layer 20sl, oxygen deficiency tends to occur particularly in the surface layer portion of the channel region 20c in the second semiconductor layer 18s (the high oxide region 20hox). Since the degree of oxidation S3 of this surface layer portion of the channel region 20c is higher than the degrees of oxidation S1, S2 of the other regions, higher electric resistance according to the degree of oxidation S3 can be ensured in this surface layer portion of the channel region 20c than in the other regions. This can stabilize the threshold voltage of the TFT 26.

The source electrode 24sd and the drain electrode 24dd are comprised of, e.g., a stack of a titanium (Ti) layer 21s, 21d, an aluminum (Al) layer 22s, 22d, and a molybdenum nitride (MoN) layer 23s, 23d, which are sequentially stacked in this order. As described in detail below, the titanium layer 21s, 21d is formed by patterning a titanium film, which is formed as a solid film on the substantially entire substrate, by dry etching. The aluminum layer 22s, 22d and the molybdenum nitride layer 23s, 23d are formed by patterning a stacked film of an aluminum film and a molybdenum nitride film, which is formed as a solid stacked film on the substantially entire substrate, by wet etching.

As shown in FIG. 4 (B-B section), the storage capacitor 27 includes: a lower electrode 14hd formed by a part of the storage capacitor line 14hl and covered by the gate insulating film 16; a dielectric layer 16h as a part of the gate insulating film 16 which corresponds to the lower electrode 14hd; and an island-shaped upper electrode 24hd overlapping the lower electrode 14hd with the dielectric layer 16h interposed therebetween. The lower electrode 14hd and the storage capacitor line 14hl have a stacked structure (TiN/Ti/Al) similar to that of the gate line 14gl and the gate electrode 14gd. The upper electrode 24hd has a stacked structure (MoN/Al/Ti) 21h, 22h, 23h similar to that of the source electrode 24sd and the drain electrode 24dd.

As shown in FIG. 4, the TFT 26 and the storage capacitor 27 are covered by a protective insulating film 28 comprised of silicon oxide (SiO). This suppresses occurrence of oxygen deficiency in the oxide semiconductor layer 20sl due to hydrogen elimination in the film, which may occur in the case where the protective insulating film 28 is comprised of, e.g., silicon nitride (SiN). Contact holes 28a, 28b extending to the electrodes 24dd, 24hd are formed in the protective insulating film 28 at positions corresponding to the drain electrode 24dd of the TFT 26 and the upper electrode 24hd of the storage capacitor 27. As described in detail below, the protective insulating film 28 is provided by forming a solid film on the substantially entire substrate surface by a CVD method, and then forming the contact holes 28a, 28b therein.

The pixel electrode 30pd is comprised of, e.g., indium tin oxide (ITO), and is formed substantially on the entire pixel so as to cover the storage capacitor 27. The pixel electrode 30pd is connected to the drain electrode 22d d and the upper electrode 24hd via the contact holes 28a, 28b. The pixel electrode 30pd is directly connected to the molybdenum nitride layers 23d, 23h as the uppermost layers of the drain electrode 24dd and the upper electrode 24hd. The difference in ionization tendency between the pixel electrode 30pd comprised of ITO and the molybdenum nitride layer 23d, 23h is smaller than that between the pixel electrode 30pd and the aluminum layer 22d, 22h, and the molybdenum nitride layers 23d, 23h reduce the difference in ionization tendency between the drain electrode 24dd and the pixel electrode 30pd and between the upper electrode 24hd and the pixel electrode 30pd. This suppresses occurrence of a galvanic corrosion phenomenon between the drain electrode 24dd and the pixel electrode 30pd and between the upper electrode 24hd and the pixel electrode 30pd.

Each gate line 14gl is extended to the terminal region 10a where the gate driver IC chips 53 are mounted, and a tip end portion of the extended gate line 14gl forms a gate terminal portion 14gt shown in FIG. 3. The gate terminal portion 14gt is connected to a gate connection electrode 30gt formed on the protective insulating film 28, via a contact hole 29 shown in FIG. 4 (C-C section), which is formed in the gate insulating film 16 and the protective insulating film 28. The gate connection electrode 30gt forms an electrode that electrically connects to the gate driver IC chip 53.

Each source line 24sl is extended to the terminal region 10a where the source driver IC chips 54 are mounted, and a tip end portion of the extended source line 24sl forms a source terminal portion 24st shown in FIG. 3. The source terminal portion 24st is connected to a source connection electrode 30st formed on the protective insulating film 28, via a contact hole 28c formed in the protective insulating film 28. The source connection electrode 30st forms an electrode that electrically connects to the source driver IC chip 54.

Each storage capacitor line 14hl is provided so that both ends thereof extend to the region where the sealant 51 is provided, and each of the ends of the storage capacitor line 14hl forms a storage capacitor terminal portion 14ht shown in FIG. 3. Each storage capacitor terminal portion 14ht is connected to a common line 14cl, and is electrically connected to a common electrode of the counter substrate 50 described below by so-called common transfer. Thus, each storage capacitor terminal portion 14ht forms an electrode that applies to the storage capacitor line 14hl a common voltage similar to that of the common electrode.

(Configuration of Counter Substrate 50)

Although not shown in the figures, the counter substrate 50 includes: a black matrix provided in a grid pattern on an insulating substrate as a base substrate so as to correspond to the gate lines 14gl and the source lines 24sl; color filters of a plurality of colors including red, green, and blue layers periodically arranged between the grid lines of the black matrix; a common electrode provided so as to cover the black matrix and the color filters; and a columnar photo spacer provided on the common electrode.

(Operation of LCD Device S)

In the LCD device S having the above configuration, when the TFT 26 in each pixel is turned on in response to a gate signal sent from the gate driver IC chip 53 to the gate electrode 14gd through the gate line 14gl, a source signal is sent from the source driver IC chip 54 to the source electrode 24sd through the source line 24sl, so that a predetermined amount of charge is written to the pixel electrode 30pd through the oxide semiconductor layer 20sl and the drain electrode 24dd, and the storage capacitor 27 is charged. At this time, a potential difference is generated between the pixel electrode 30pd of the TFT substrate 10 and the common electrode of the counter substrate 50, whereby a predetermined voltage is applied to the liquid crystal layer 52. When the TFT 26 is off, storage capacitance formed in the storage capacitor 27 suppresses a decrease in voltage written to the corresponding pixel electrode 30pd. In the LCD device S, the alignment state of liquid crystal molecules is changed in each pixel according to the magnitude of the voltage applied to the liquid crystal layer 52, whereby light transmittance of the liquid crystal layer 52 is adjusted, and an image is displayed.

Manufacturing Method

Figure 5:
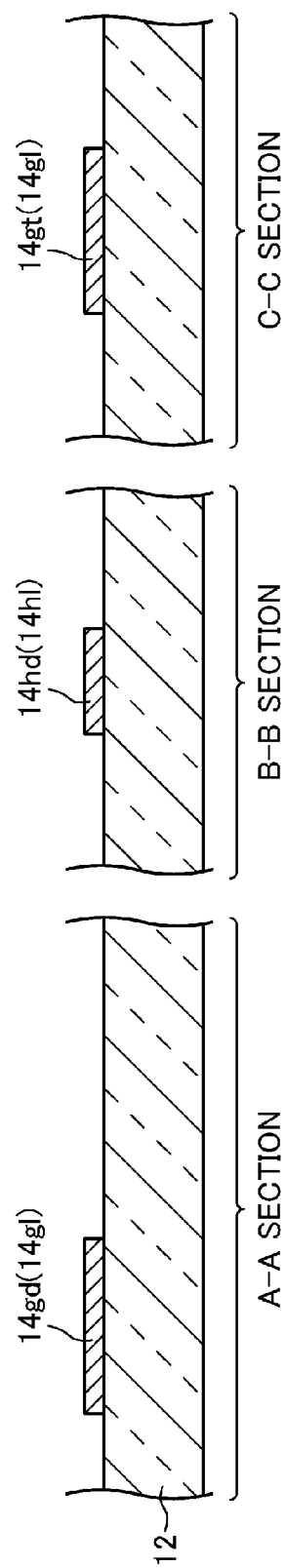
FIG. 5 is a cross-sectional view corresponding to FIG. 4, showing the state where a gate electrode has been formed in a first patterning step in a manufacturing method of the TFT substrate according to the first embodiment.
Figure 6:
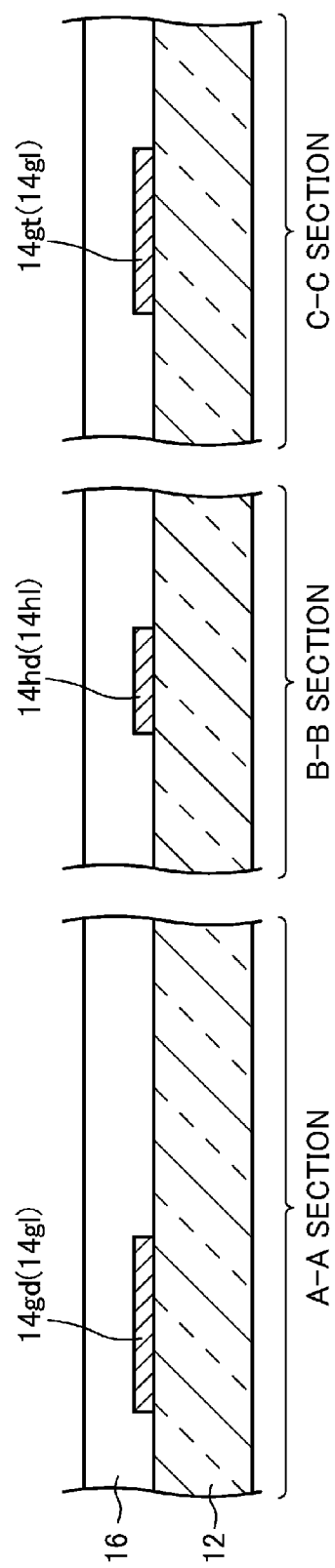
FIG. 6 is a cross-sectional view corresponding to FIG. 4, showing the state where a gate insulating film has been formed in a gate insulating film formation step in the manufacturing method of the TFT substrate according to the first embodiment.
Figure 7:
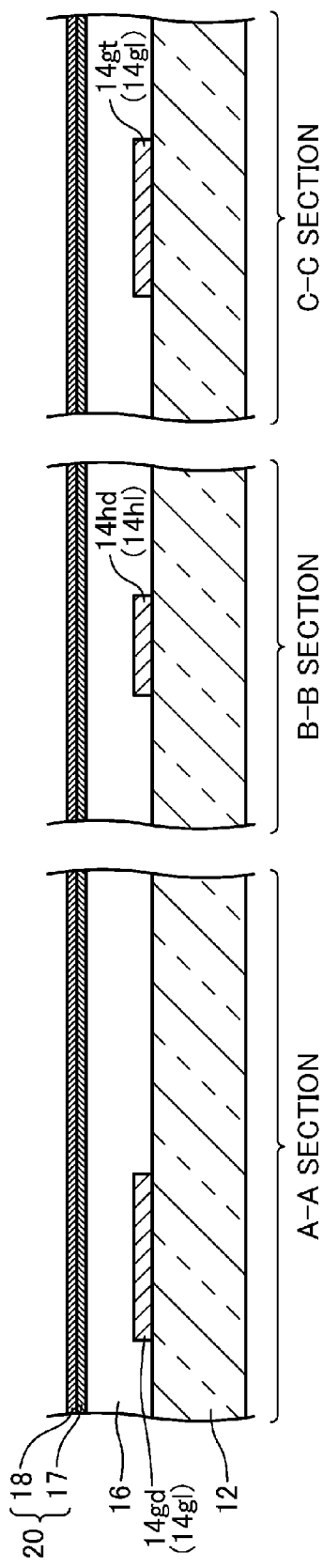
FIG. 7 is a cross-sectional view corresponding to FIG. 4, showing the state where a stacked semiconductor film has been formed in a second patterning step in the manufacturing method of the TFT substrate according to the first embodiment.
Figure 8:
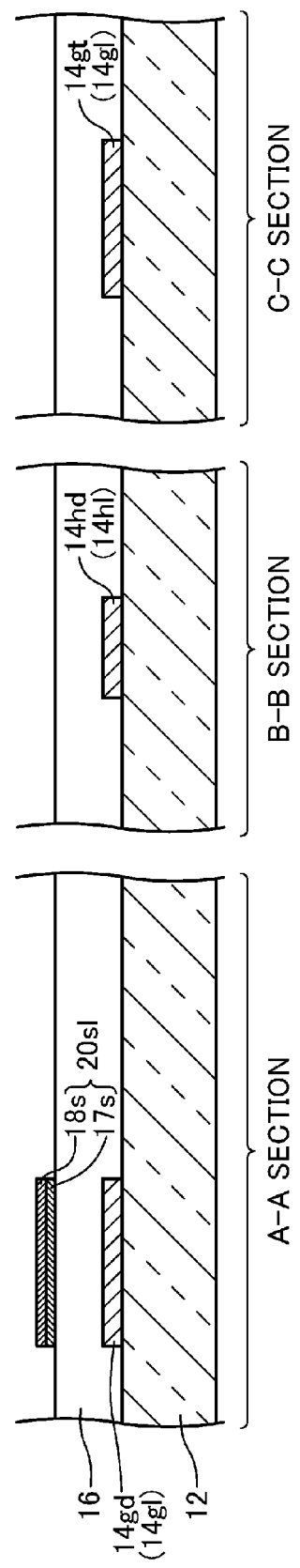
FIG. 8 is a cross-sectional view corresponding to FIG. 4, showing the state where an oxide semiconductor layer has been formed in the second patterning step in the manufacturing method of the TFT substrate according to the first embodiment.
Figure 9:
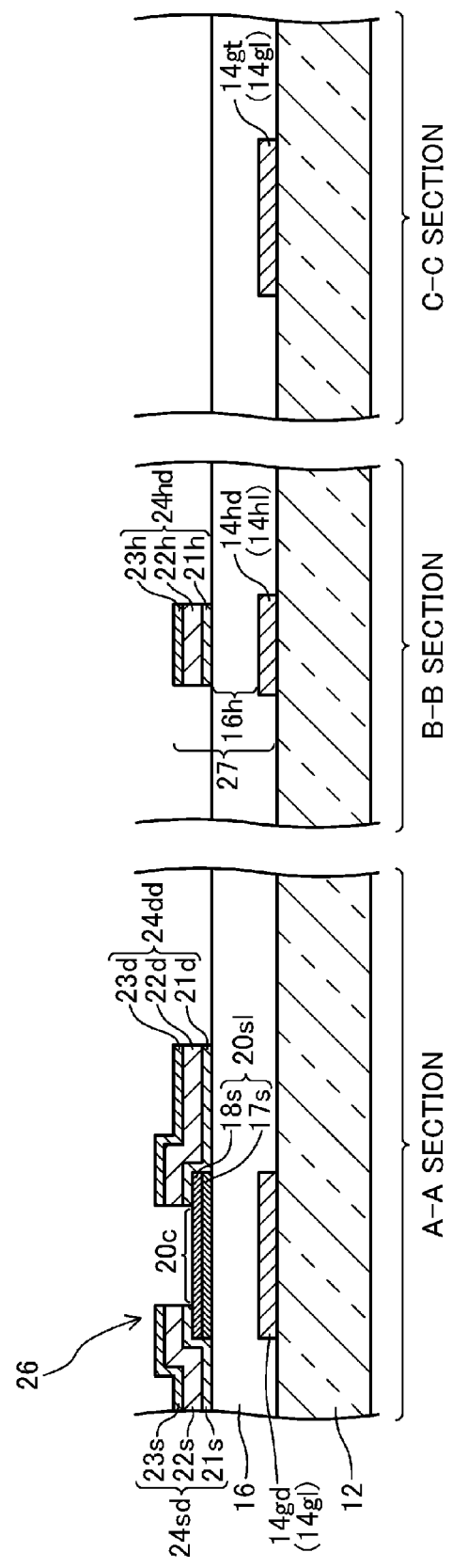
FIG. 9 is a cross-sectional view corresponding to FIG. 4, showing the state where a source electrode and a drain electrode have been formed in a third patterning step in the manufacturing method of the TFT substrate according to the first embodiment.
Figure 10:
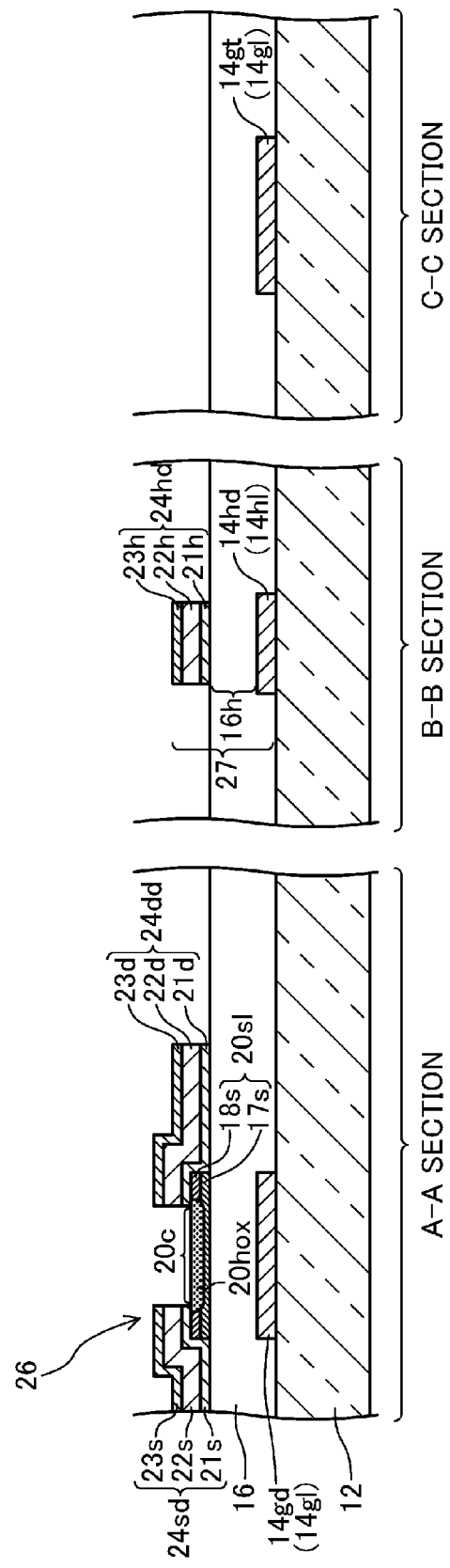
FIG. 10 is a cross-sectional view corresponding to FIG. 4, showing the state where the oxide semiconductor layer has been annealed in the manufacturing method of the TFT substrate according to the first embodiment.
Figure 11:
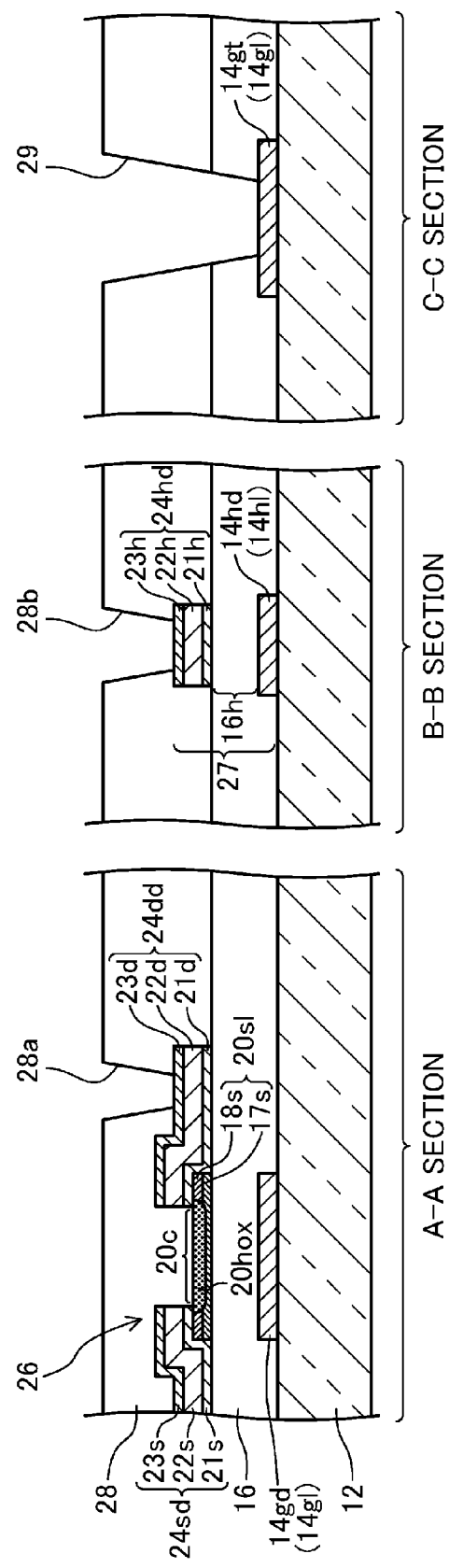
FIG. 11 is a cross-sectional view corresponding to FIG. 4, showing the state where a protective insulating film has been formed in a fourth patterning step in the manufacturing method of the TFT substrate according to the first embodiment.

An example of a method for manufacturing the TFT substrate 10 and the LCD device S will be described below with reference to FIGS. 5-11. FIG. 5 is a cross-sectional view showing a first patterning step in the manufacturing method of the TFT substrate 10. FIG. 6 is a cross-sectional view showing a gate insulating film formation step in the manufacturing method of the TFT substrate 10. FIGS. 7 and 8 are cross-sectional views showing a second patterning step in the manufacturing method of the TFT substrate 10. FIG. 9 is a cross-sectional view showing a third patterning step in the manufacturing method of the TFT substrate 10. FIG. 10 is a cross-sectional view showing the substrate state after annealing in the manufacturing method of the TFT substrate 10. FIG. 11 is a cross-sectional view showing a fourth patterning step in the manufacturing method of the TFT substrate 10. FIGS. 5-11 show the regions corresponding to FIG. 4.

The manufacturing method of the LCD device S of the present embodiment includes a TFT substrate manufacturing step, a counter substrate manufacturing step, a bonding step, and a mounting step.

(TFT Substrate Manufacturing Step)

The TFT substrate manufacturing step includes a first patterning step, a gate insulating film formation step, and second to fifth patterning steps.

(First Patterning Step)

For example, an aluminum (Al) film, a titanium (Ti) film, and a titanium nitride (TiN) film are sequentially formed by a sputtering method on an insulating substrate 12 such as a glass substrate prepared in advance, thereby forming a stacked conductive film. Then, by photolithography using a first photomask, a resist pattern is formed on the regions of the stacked conductive film where a gate line 14gl, a gate electrode 14gd, a storage capacitor line 14hl, and a lower electrode 14hd are to be formed. Thereafter, reactive ion etching (RIE) using a chlorine gas, which is a type of dry etching, is performed by using the resist pattern as a mask. Subsequently, delamination of the resist pattern and cleaning are performed by using a resist delamination solution, whereby the gate line 14gl, the gate electrode 14gd, the storage capacitor line 14hl, and the lower electrode 14hd are simultaneously formed as shown in FIG. 5.

(Gate Insulating Film Formation Step)

A silicon oxide film is formed by a CVD method over the substrate having the gate electrode 14gd, the lower electrode 14hd, etc., thereby forming a gate insulating film 16 as shown in FIG. 6.

(Second Patterning Step)

First, a first oxide semiconductor film 17, which is comprised of an In—Ga—Zn—O-based oxide semiconductor having a high degree of oxidation, is formed by a sputtering method on the substrate having the gate insulating film 16. Specifically, the first oxide semiconductor film 17 is formed with a thickness of about 30 nm to 100 nm by, e.g., using oxides containing indium (In), gallium (Ga), and zinc (Zn) ($In_2O_3$:$Ga_2O_3$:ZnO=1:1:1) as a target in a mixed gas atmosphere of argon (Ar) and oxygen ($O_2$), at a total flow rate of the mixed gas in the range of 200 sccm to 400 sccm with the oxygen gas in the range of 20 sscm to 100 sccm, a chamber vacuum degree of about 0.1 Pa to 2.0 Pa, and DC power of about 3 kW to 20 kW. As used herein, "sccm" stands for "standard cubic centimeters per minute," and represents a unit of flow rate per minute (cc). The values of the gas flow rate and the DV power shown above are by way of illustration only, and the gas flow rate and the DV power depend on the size of the chamber, the substrate, etc.

Next, a second oxide semiconductor film 18, which is comprised of an In—Ga—Zn—O-based oxide semiconductor having a lower degree of oxidation than the first oxide semiconductor layer 17, is formed on the first oxide semiconductor film 17 by a sputtering method. Specifically, the second oxide semiconductor film 18 is formed with a thickness of about 30 nm to 100 nm by, e.g., using oxides containing indium (In), gallium (Ga), and zinc (Zn) ($In_2O_3$:$Ga_2O_3$:ZnO=1:1:1) as a target in a mixed gas atmosphere of argon (Ar) and oxygen ($O_2$), at a total flow rate of the mixed gas in the range of 200 sccm to 400 sccm with the oxygen gas in the range of 0 sscm to 20 sccm, a chamber vacuum degree of about 0.1 Pa to 2.0 Pa, and DC power of about 3 kW to 20 kW. A stacked semiconductor layer 20 shown in FIG. 7 is formed in this manner.

Then, a resist pattern is formed on the stacked semiconductor film 20 by photolithography using a second photomask, and wet etching using an oxalic acid solution is performed on the stacked semiconductor film 20 by using the resist pattern as a mask. Subsequently, delamination of the resist pattern and cleaning are performed by using a resist delamination solution, whereby an oxide semiconductor layer 20*sl* is formed as shown in FIG. 8.

(Third Patterning Step)

First, a titanium (Ti) film, an aluminum (Al) film, and a molybdenum nitride (MoN) film are sequentially formed by a sputtering method on the substrate having the oxide semiconductor layer 20*sl*, thereby forming a stacked conductive film. Next, by photolithography using a third photomask, a resist pattern is formed on the regions of the stacked conductive film where a source line 24*sl*, a source electrode 24*sd*, a drain electrode 24*dd*, and an upper electrode 24*hd* are to be formed.

Then, by using the resist pattern as a mask, the upper two layers of the stacked conductive film, namely the aluminum film and the molybdenum nitride film, are wet etched with a mixture of phosphoric acid, acetic acid, and nitric acid, thereby forming aluminum layers 22*s*, 22*d*, 22*h* and molybdenum nitride layers 23*s*, 23*d*, 23*h* which form the source line 24*sl*, the source electrode 24*sd*, the drain electrode 24*dd*, and the upper electrode 24*hd*.

Moreover, by using the resist pattern, the aluminum layers 22*s*, 22*d*, 22*h*, and the molybdenum nitride layers 23*s*, 23*d*, 23*h* as a mask, the remaining titanium film is patterned by RIE to simultaneously form the source line 24*sl*, the source electrode 24*sd*, the drain electrode 24*dd*, and the upper electrode 24*hd*, as shown in FIG. 9, thereby forming a TFT 26 and a storage capacitor 27. For example, the RIE is performed under the following etching conditions. A mixed gas of $Cl_2$ (flow rate: about 100 sccm) and $BCl_3$ (flow rate: about 100 sccm) is used as a source gas, a chamber pressure is about 4 Pa, and high frequency power is about 1,100 W.

Thereafter, the substrate having the source electrode 24*sd* and the drain electrode 24*dd* is subjected to water vapor annealing in a water vapor anneal chamber. This water vapor annealing is performed for, e.g., 10 to 180 minutes at about 100° C. to 450° C. at an atmospheric pressure in an atmosphere containing oxygen and water vapor by using an oxygen gas as a carrier gas. This annealing causes an oxidation reaction in the oxide semiconductor layer 20*sl* from the surface layer of the channel region 20*c* exposed from the source electrode 24*sd* and the drain electrode 24*dd*, whereby a high oxide region 20*hox* is formed as shown in FIG. 10. Since the oxide semiconductor layer 20*sl* has a two-layer structure, the oxidation reaction caused by the annealing can be suppressed at the interface between the first semiconductor layer 17*s* and the second semiconductor layer 18*s*. This can prevent the oxidation reaction from proceeding all the way to the interface of a channel region 20*c* with the gate insulating film 16 along the entire thickness of the oxide semiconductor layer 20*sl*.

(Fourth Patterning Step)

First, a silicon oxide film is formed by a CVD method on the substrate having the source electrode 24*sd*, the drain electrode 24*dd*, etc., thereby forming a protective insulating film 28. Next, by photolithography using a fourth photomask, a resist pattern is formed on the regions of the protective insulating film 28 where contact holes 28*a*, 28*b*, 28*c*, 29 are to be formed. By using the resist pattern as a mask, the protective insulating film 28 is patterned by RIE using a fluorine gas. Then, delamination of the resist pattern and cleaning are performed by using a resist delamination solution, thereby forming the contact holes 28*a*, 28*b*, 28*c*, 29 as shown in FIG. 11.

(Fifth Patterning Step)

A transparent conductive film such as, e.g., ITO is formed by a sputtering method on the substrate having the contact holes 28*a*, 28*b*, 28*c*, 29 in the protective insulating film 28. Then, by photolithography using a fifth photomask, a resist pattern is formed on the regions of the transparent conductive film where a pixel electrode 30*pd*, a gate connection electrode 30*gt*, and a source connection electrode 30*st* are to be formed. By using the resist pattern as a mask, the transparent conductive film is wet etched with an oxalic acid solution. Subsequently, delamination of the resist pattern and cleaning are performed by using a resist delamination solution, thereby forming the pixel electrode 30*pd*, the gate connection electrode 30*gt*, and the source connection electrode 30*st*.

The TFT substrate 10 shown in FIG. 4 can be manufactured in this manner.

(Counter Substrate Manufacturing Step)

First, an insulating substrate such as a glass substrate is coated with, e.g., a black-colored photosensitive resin by a spin coating method or a slit coating method. Next, the coated film is exposed to light via a photomask, and then is developed, thereby patterning the photosensitive resin into a black matrix.

Thereafter, the substrate having the black matrix is coated with, e.g., a red, green, or blue-colored negative acrylic photosensitive resin. The coated film is exposed to light via a photomask, and then is developed, thereby patterning the photosensitive resin into a colored layer of a selected color (e.g., a red layer). A similar process is repeated to form colored layers of the other two colors (e.g., a green layer and a blue layer). Color filters are formed in this manner.

Then, for example, an ITO film is formed by a sputtering method on the substrate having the color filters, thereby forming a common electrode. Subsequently, the substrate having the common electrode is coated with a positive phenol novolac photosensitive resin by a spin coating method. The coated film is exposed to light via a photomask, and then is developed, thereby patterning the photosensitive resin into a photo spacer.

The counter substrate 50 can be manufactured in this manner.

(Bonding Step)

First, the surface of the TFT substrate 10 is coated with a polyimide resin by a printing method, and the coated film is then subjected to baking and rubbing processes to form an alignment film 55. The surface of the counter substrate 50 is also coated with a polyimide resin by a printing method, and the coated film is then subjected to baking and rubbing processes to form an alignment film 56.

Thereafter, by using, e.g., a dispenser etc., a sealant 51 comprised of an ultraviolet (UV)-curable, thermosetting resin etc. is applied in the shape of a rectangular frame to the counter substrate 50 having the alignment film 56. Subsequently, a predetermined amount of liquid crystal material is dropped onto a region inside the sealant 51 on the counter substrate 50.

Then, the counter substrate 50 having the liquid crystal material dropped thereon and the TFT substrate 10 having the alignment film 55 are bonded together under a reduced pressure, and the bonded body of the counter substrate 50 and the TFT substrate 10 is exposed to an atmospheric pressure to press the surfaces of the bonded body. Moreover, the sealant 51 of the bonded body is irradiated with UV light to preliminarily cure the sealant 51, and then the resultant bonded body is heated to permanently cure the sealant 51, whereby the TFT substrate 10 is bonded to the counter substrate 50.

Thereafter, polarizers 57, 58 are respectively bonded to the outer surfaces of the TFT substrate 10 and the counter substrate 50 that have been bonded together.

(Mounting Step)

Anisotropic conductive films (ACFs) are formed on the terminal region 10a of the bonded body having the polarizers 57, 57 bonded to both surfaces thereof. Then, gate driver IC chips 53 and source driver IC chips 54 are thermocompression bonded to the terminal region 10a with the ACFs interposed therebetween, thereby mounting the driver IC chips 53, 54 on the bonded body.

The LCD device S can be manufactured by the steps described above.

Advantages of First Embodiment

According to the first embodiment, in the oxide semiconductor layer 20sl of the TFT 26, the degree of oxidation S1 of the first semiconductor layer 17s and the degree of oxidation S2 of the second semiconductor layer 18s in the connection regions with the source electrode 24sd and the drain electrode 24dd have a relation of S2<S1. Moreover, in the oxide semiconductor layer 20sl, the degree of oxidation S3 of the surface layer portion of the channel region 20c is higher than the degrees of oxidation S1, S2 of the other regions. This can stabilize the threshold voltage while increasing the mobility and on-state current of the channel etch TFT 26 using the oxide semiconductor layer 20sl, and thus can stably ensure satisfactory characteristics. As a result, display quality can be improved while reducing manufacturing cost of the TFT substrate 10 and the LCD device S.

Second Embodiment of Invention

Figure 12:
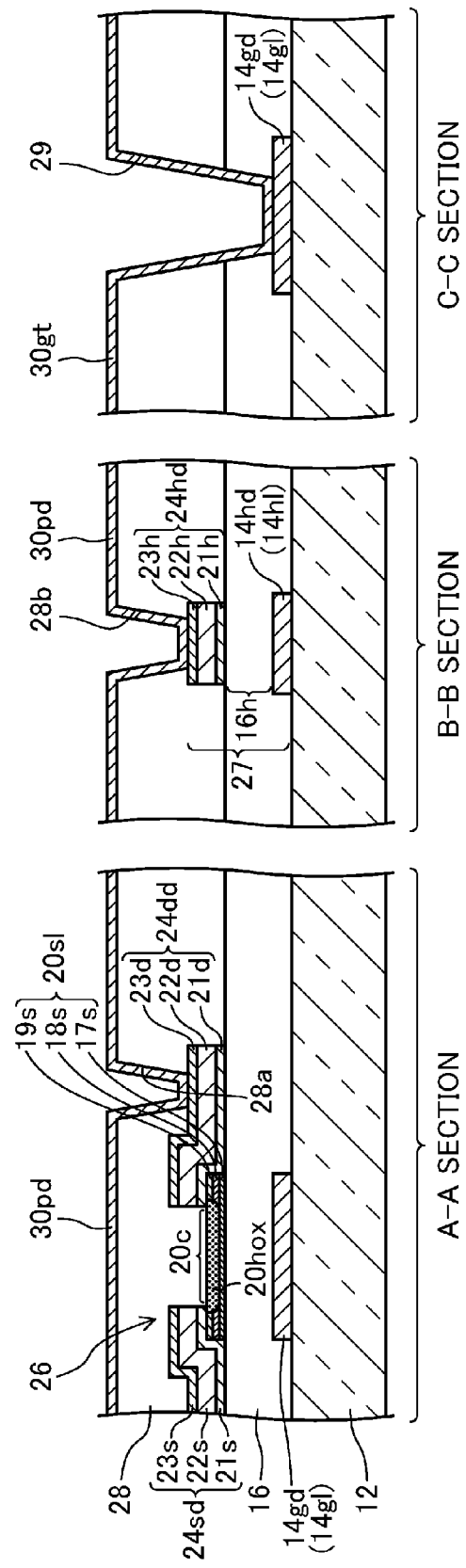
FIG. 12 is a cross-sectional view corresponding to FIG. 4, schematically showing a configuration of a pixel and terminal portions of interconnects in a TFT substrate according to a second embodiment.

FIG. 12 is a plan view showing a schematic configuration of a pixel and terminal portions of interconnects in a TFT substrate 10 according to a second embodiment. In the following embodiments, since an LCD device S is configured in a manner similar to that of the first embodiment except the configuration of the TFT substrate 10, only the TFT substrate 10 having a different configuration is described. Since the same configurations as those of the first embodiment are described in the first embodiment with reference to FIGS. 1-11, detailed description thereof will be omitted.

In the first embodiment, the oxide semiconductor layer 20sl in the TFT 26 has a two-layer structure. However, an oxide semiconductor layer 20sl of the present embodiment has a three-layer structure formed by sequentially stacking a first semiconductor layer 17s comprised of an In—Ga—Zn—O-based oxide semiconductor having a high degree of oxidation, a second semiconductor layer 18s comprised of an In—Ga—Zn—O-based oxide semiconductor having a lower degree of oxidation than the first semiconductor layer 17s, and a third semiconductor layer 19s comprised of an In—Ga—Zn—O-based oxide semiconductor having a lower degree of oxidation than the second semiconductor layer 18s.

A high oxide region 20hox having a higher degree of oxidation than the first semiconductor layer 17s is formed in channel region portions of the second semiconductor layer 18s and the third semiconductor layer 19s. As in the first embodiment, this high oxide region 20hox is formed by annealing the oxide semiconductor layer 20sl in an oxygen-containing atmosphere after formation of a source electrode 24sd and a drain electrode 24dd. The high oxide region 20hox slightly extends in the connection regions with the source electrode 24sd and the drain electrode 24dd in the second semiconductor layer 18s and the third semiconductor layer 19s.

In the oxide semiconductor layer 20sl, the portion located on the side of a gate insulating film 16 corresponds to the first semiconductor layer 17s, the surface layer portions located in the connection regions with the source electrode 24sd and the drain electrode 24dd correspond to the portions of the second semiconductor layer 18s and the third semiconductor layer 19s which are located in the connection regions with the source electrode 24sd and the drain electrode 24dd, and the surface layer portion of the channel region 20c corresponds to the channel region portions of the second semiconductor layer 18s and the third semiconductor layer 19s.

Although the high oxide region 12h ox is not formed in the first semiconductor layer 17s in FIG. 12, the high oxide region 12h ox may slightly extend in the first semiconductor layer 17s. In the present embodiment, the high oxide region 20hox is formed in the channel region portions of the second semiconductor layer 18s and the third semiconductor layer 19s. However, the high oxide region 20hox may be formed only in the channel region portion of the third semiconductor layer 19s. In this case, in the oxide semiconductor layer 20sl, the portion located on the side of the gate insulating film 16 corresponds to the first semiconductor layer 17s and the second semiconductor layer 18s, the surface layer portions located in the connection regions with the source electrode 24sd and the drain electrode 24dd correspond to the portions of the third semiconductor layer 19s which are located in the connection regions with the source electrode 24sd and the drain electrode 24dd, and the surface layer portion of the channel region 20c corresponds to the channel region portion of the third semiconductor layer 19s.

As described above, the degree of oxidation S1 of the first semiconductor layer 17s, the degree of oxidation S2-1 of the portions of the second semiconductor layer 18s which are located in the connection regions with the source electrode 24sd and the drain electrode 24dd, the degree of oxidation S2-2 of the portions of the third semiconductor layer 19s which are located in the connection regions with the source electrode 24sd and the drain electrode 24dd, and the degree of oxidation S3 of the high oxide region 20hox have a relation of S2-2<S2-1<S1<S3. This can stabilize the threshold voltage while increasing the mobility and on-state current of the TFT 26.

In other words, in the oxide semiconductor layer 20sl, the degree of oxidation S1 of the first semiconductor layer 17s, the degree of oxidation S2-1 of the portions of the second semiconductor layer 18s which are located in the connection regions with the source electrode 24sd and the drain electrode 24dd, and the degree of oxidation S2-2 of the portions of the third semiconductor layer 19s which are located in the connection regions with the source electrode 24sd and the drain electrode 24dd have a relation of S2-2<S2-1<S1. Accordingly, in the surface layer portions of the oxide semiconductor layer 20sl which are located in the connection regions with the source electrode 24sd and the drain electrode 24dd, the electric resistance can be reduced according to the degrees of oxidation S2-1, S2-2. This reduces the contact resistance between the oxide semiconductor layer 20sl and the source electrode 24sd and between the oxide semiconductor layer 20sl and the drain electrode 24dd, whereby the mobility and on-state current of the TFT 26 can be increased. Even if the source and drain electrodes are formed by dry etching, and a protective insulating film is formed by a vapor deposition method such as a CVD method, oxygen deficiency is compensated for and alteration is suppressed in the portion of the oxide semiconductor layer 20sl which is located on the side of the gate insulating film 16. Thus, higher electric resistance according to the degree of oxidation S1 can be ensured in the portion of the oxide semiconductor layer 20sl which is located on the side of the gate insulating film 16 than in the portions of the second semiconductor layer 18s and the third semiconductor layer 19s which are located in the connection regions with the source and drain electrodes. In the oxide semiconductor layer 20sl, oxygen deficiency tends to occur particularly in the portions of the channel region 20c in the second semiconductor layer 18s and the third semiconductor layer 19s (the high oxide region 20hox). Since the degree of oxidation S3 of these portions is higher than the degrees of oxidation S1, S2 of the other regions, higher electric resistance according to the degree of oxidation S3 can be ensured in the surface layer portion of the channel region 20c than in the other regions. This can stabilize the threshold voltage of the TFT 26.

Manufacturing Method

Figure 13:
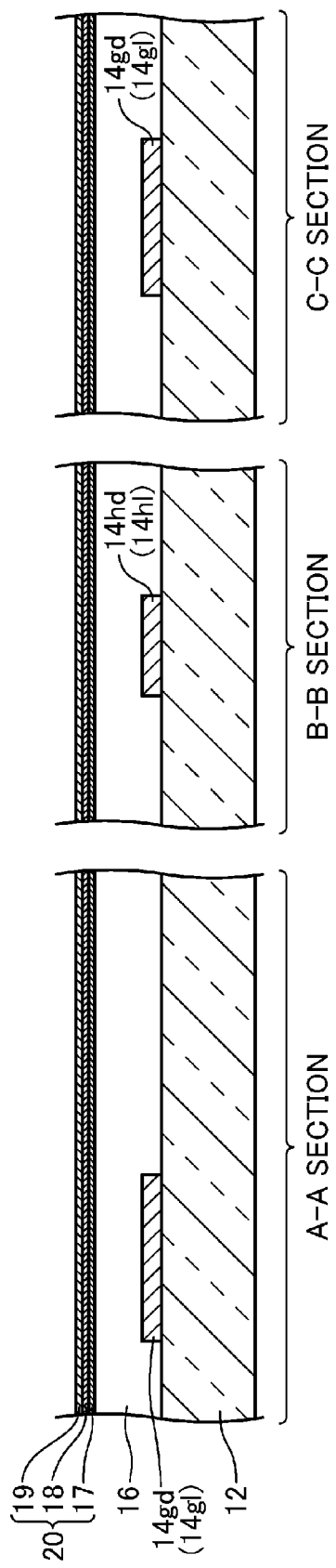
FIG. 13 is a cross-sectional view corresponding to FIG. 12, showing the state where a stacked semiconductor film has been formed in a second patterning step in a manufacturing method of the TFT substrate according to the second embodiment.
Figure 14:
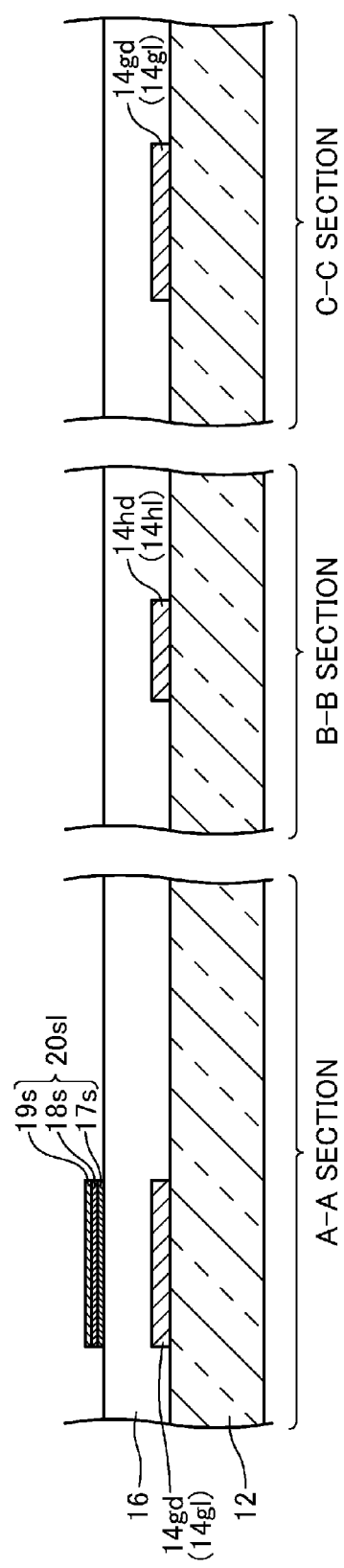
FIG. 14 is a cross-sectional view corresponding to FIG. 12, showing the state where an oxide semiconductor layer has been formed in the second patterning step in the manufacturing method of the TFT substrate according to the second embodiment.
Figure 15:
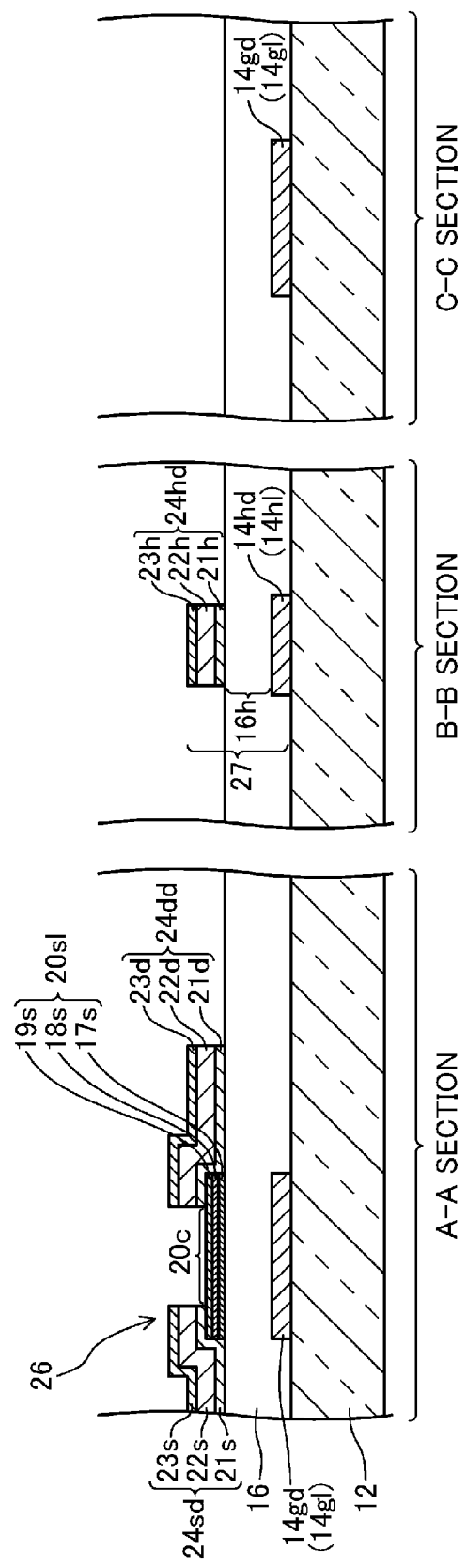
FIG. 15 is a cross-sectional view corresponding to FIG. 12, showing the state where a source electrode and a drain electrode have been formed in a third patterning step in the manufacturing method of the TFT substrate according to the second embodiment.
Figure 16:
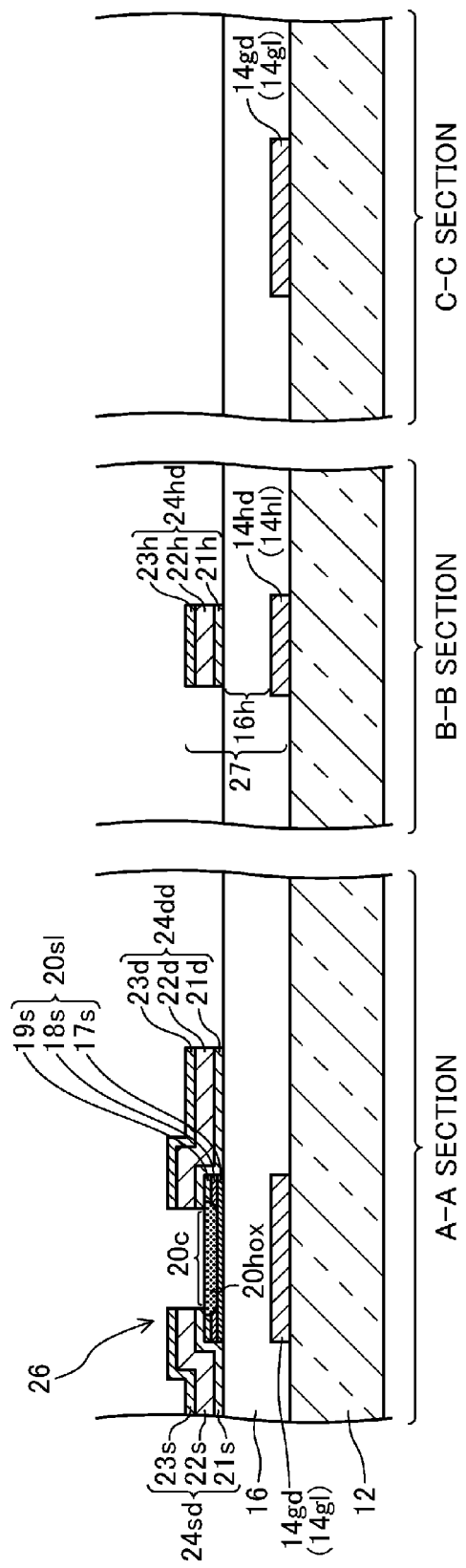
FIG. 16 is a cross-sectional view corresponding to FIG. 12, showing the state where the oxide semiconductor layer has been annealed in the manufacturing method of the TFT substrate according to the second embodiment.
Figure 17:
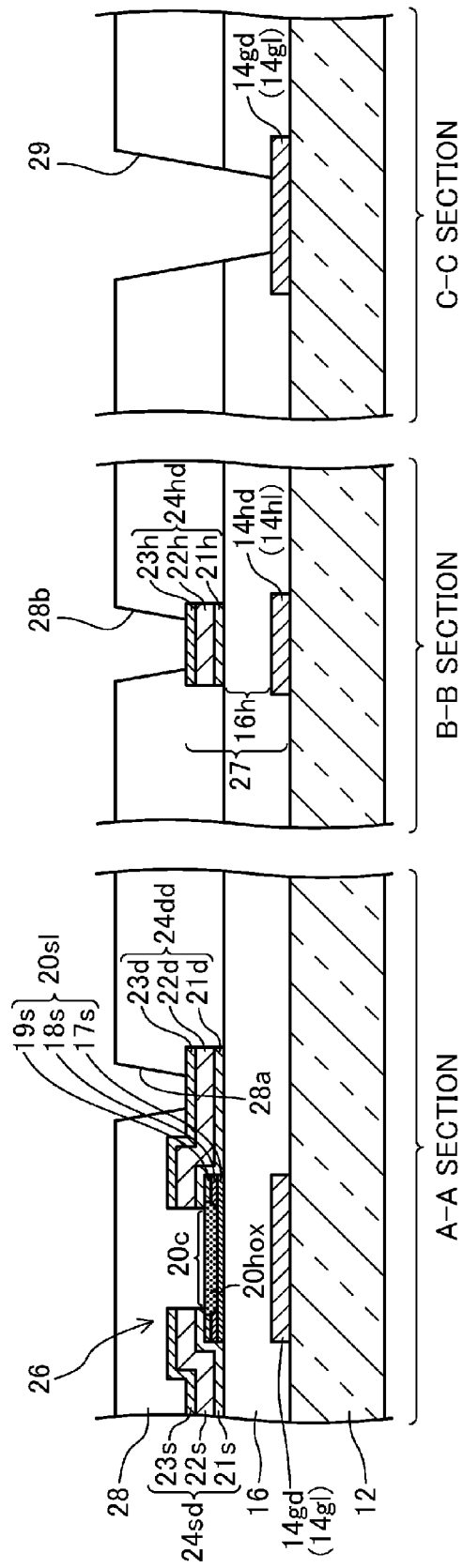
FIG. 17 is a cross-sectional view corresponding to FIG. 12, showing the state where a protective insulating film has been formed in a fourth patterning step in the manufacturing method of the TFT substrate according to the second embodiment.

A method for manufacturing the TFT substrate 10 will be described below with reference to FIGS. 13-17. FIGS. 13 and 14 are cross-sectional views showing a second patterning step. FIG. 15 is a cross-sectional view showing a third patterning step. FIG. 16 is a cross-sectional view showing the substrate state after annealing. FIG. 17 is a cross-sectional view showing a fourth patterning step. FIGS. 13-17 show the regions corresponding to FIG. 12.

A TFT substrate manufacturing step of the present embodiment also includes a first patterning step, a gate insulating film formation step, and second to fifth patterning steps. Since the first patterning step and the gate insulating film formation step are similar to those of the first embodiment, description thereof will be omitted.

(Second Patterning Step)

First, a first oxide semiconductor film 17, which is comprised of an In—Ga—Zn—O-based oxide semiconductor having a high degree of oxidation, is formed by a sputtering method on a substrate having a gate insulating film 16. Specifically, the first oxide semiconductor film 17 is formed with a thickness of about 30 nm to 100 nm by, e.g., using oxides containing indium (In), gallium (Ga), and zinc (Zn) ($In_2O_3$: $Ga_2O_3$:ZnO=1:1:1) as a target in a mixed gas atmosphere of argon (Ar) and oxygen ($O_2$), at a total flow rate of the mixed gas in the range of 200 sccm to 400 sccm with the oxygen gas in the range of 20 sscm to 100 sccm, a chamber vacuum degree of about 0.1 Pa to 2.0 Pa, and AC power of about 3 kW to 20 kW.

Next, a second oxide semiconductor film 18, which is comprised of an In—Ga—Zn—O-based oxide semiconductor having a lower degree of oxidation than the first oxide semiconductor layer 17, is formed on the first oxide semiconductor film 17 by a sputtering method. Specifically, the second oxide semiconductor film 18 is formed with a thickness of about 30 nm to 100 nm by, e.g., using oxides containing indium (In), gallium (Ga), and zinc (Zn) ($In_2O_3$:$Ga_2O_3$: ZnO=1:1:1) as a target in a mixed gas atmosphere of argon (Ar) and oxygen ($O_2$), at a total flow rate of the mixed gas in the range of 200 sccm to 400 sccm with the oxygen gas in the range of 20 sscm to 20 sccm, a chamber vacuum degree of about 0.1 Pa to 2.0 Pa, and AC power of about 3 kW to 20 kW.

Then, a third oxide semiconductor film 19, which is comprised of an In—Ga—Zn—O-based oxide semiconductor having a lower degree of oxidation than the second oxide semiconductor layer 18, is formed on the second oxide semiconductor film 18 by a sputtering method. Specifically, the third oxide semiconductor film 19 is formed with a thickness of about 30 nm to 100 nm by, e.g., using oxides containing indium (In), gallium (Ga), and zinc (Zn) ($In_2O_3$:$Ga_2O_3$: ZnO=1:1:1) as a target in a mixed gas atmosphere of argon (Ar) and oxygen ($O_2$), at a total flow rate of the mixed gas in the range of 200 sccm to 400 sccm with the oxygen gas in the range of 0 sscm to 10 sccm, a chamber vacuum degree of about 0.1 Pa to 2.0 Pa, and AC power of about 3 kW to 20 kW. A stacked semiconductor layer 20 shown in FIG. 13 is formed in this manner.

Thereafter, a resist pattern is formed on the stacked semiconductor film 20 by photolithography using a second photomask, and wet etching using an oxalic acid solution is performed on the stacked semiconductor film 20 by using the resist pattern as a mask. Subsequently, delamination of the resist pattern and cleaning are performed by using a resist delamination solution, whereby an oxide semiconductor layer 20sl is formed as shown in FIG. 14.

(Third Patterning Step)

As in the first embodiment, a titanium (Ti) film, an aluminum (Al) film, and a molybdenum nitride (MoN) film are sequentially formed on the substrate having the oxide semiconductor layer 20sl, thereby forming a stacked conductive film. Then, by photolithography using a third photomask, the upper two layers of the stacked conductive film, namely the aluminum film and the molybdenum nitride film, are patterned by wet etching, and the remaining titanium film is patterned by RIE to simultaneously form a source line 24sl, a source electrode 24sd, a drain electrode 24dd, and an upper electrode 24hd, as shown in FIG. 15, thereby forming a TFT 26 and a storage capacitor 27.

Thereafter, the substrate having the source electrode 24sd and the drain electrode 24dd is subjected to water vapor annealing in a water vapor anneal chamber. This water vapor annealing is performed for, e.g., 10 to 180 minutes at about 100° C. to 450° C. at an atmospheric pressure in an atmosphere containing oxygen and water vapor by using an oxygen gas as a carrier gas. This annealing causes an oxidation reaction in the oxide semiconductor layer 20sl from the surface layer of the channel region 20c exposed from the source electrode 24sd and the drain electrode 24dd, whereby a high oxide region 20hox is formed as shown in FIG. 16. Since the oxide semiconductor layer 20sl has a three-layer structure, the oxidation reaction caused by the annealing can be suppressed at the interface between the second semiconductor layer 18s and the third semiconductor layer 19s and the interface between the first semiconductor layer 17s and the second semiconductor layer 18s. This can satisfactorily prevent the oxidation reaction from proceeding all the way to the interface of a channel region 20c with the gate insulating film 16 along the entire thickness of the oxide semiconductor layer 20sl.

(Fourth Patterning Step)

As in the first embodiment, a silicon oxide film is formed by a CVD method on the substrate having the source electrode 24sd, the drain electrode 24dd, etc., thereby forming a protective insulating film 28. Then, a resist pattern is formed by photolithography using a fourth photomask. By using the resist pattern as a mask, the protective insulating film 28 is patterned by RIE, thereby forming contact holes 28a, 28b, 28c, 29 in the protective insulating film 28, as shown in FIG. 17.

(Fifth Patterning Step)

As in the first embodiment, a transparent conductive film is formed by a sputtering method on the substrate having the contact holes 28a, 28b, 28c, 29 in the protective insulating film 28. A resist pattern is formed by photolithography using a fifth photomask. By using the resist pattern as a mask, the transparent conductive film is patterned by wet etching, thereby forming a pixel electrode 30pd, a gate connection electrode 30gt, and a source connection electrode 30st.

The TFT substrate 10 shown in FIG. 12 can be manufactured in this manner.

Advantages of Second Embodiment

According to the second embodiment, the oxide semiconductor layer 20sl has a three-layer structure. This can satisfactorily prevent the oxidation reaction from proceeding all the way to the interface of a channel region 20c with the gate insulating film 16 along the entire thickness of the oxide semiconductor layer 20sl, and thus can reliably suppress an excessive increase in electric resistance between the source electrode 24sd and the drain electrode 24dd according to the electric resistance of the channel region 20c. This can stably ensure satisfactory mobility and on-state current of the TFT 26.

Other advantages of the second embodiment are similar to those of the first embodiment.

Third Embodiment of Invention

Figure 18:
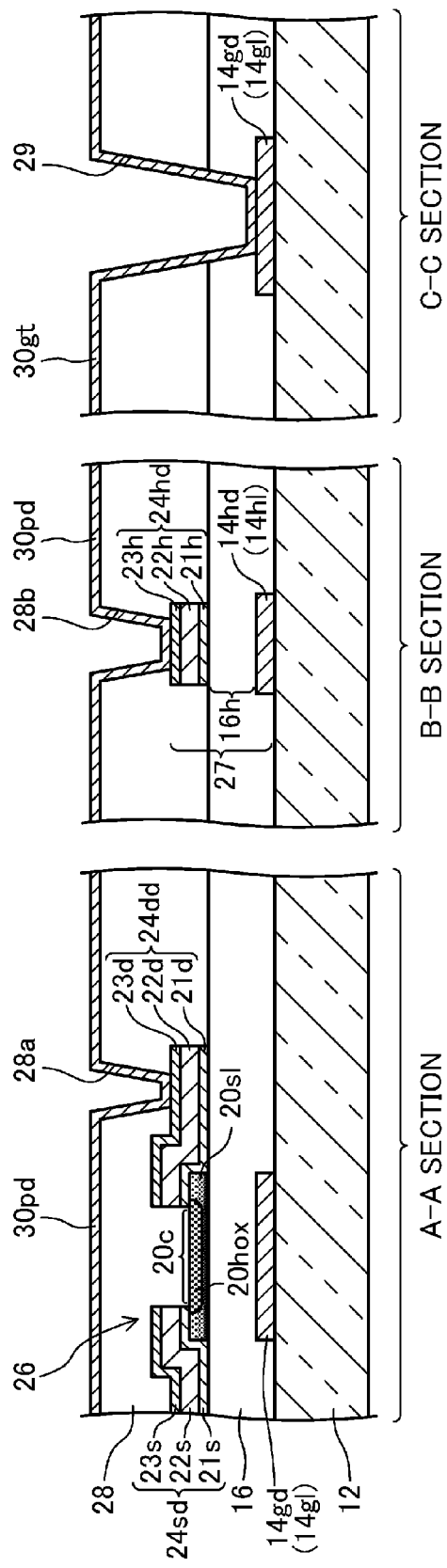
FIG. 18 is a cross-sectional view corresponding to FIG. 4, schematically showing a configuration of a pixel and terminal portions of interconnects in a TFT substrate according to a third embodiment.

FIG. 18 is a plan view showing a schematic configuration of a pixel and terminal portions of interconnects in a TFT substrate 10 according to a third embodiment.

In the first and second embodiments, the oxide semiconductor layer 20sl in the TFT 26 has a stacked structure. However, an oxide semiconductor layer 20sl of the present embodiment is formed by a single layer, and in the oxide semiconductor layer 20sl except the surface layer portion of a channel region 20c, the degree of oxidation gradually decreases from the side of a gate insulating film 16 to the side of a source electrode 24sd and a drain electrode 24dd.

A high oxide region 20hox having a higher degree of oxidation than the remaining region is formed in the surface layer portion of the channel region 20c in the oxide semiconductor layer 20sl. As in the first embodiment, this high oxide region 20hox is formed by annealing the oxide semiconductor layer 20sl in an oxygen-containing atmosphere after formation of the source electrode 24sd and the drain electrode 24dd. The high oxide region 20hox slightly extends in the connection regions with the source electrode 24sd and the drain electrode 24dd.

In the oxide semiconductor layer 20sl of the present embodiment, the degree of oxidation S1 of a portion located on the side of the gate insulating film 16, the degree of oxidation S2 of surface layer portions located in the connection regions with the source electrode 24sd and the drain electrode 24dd, and the degree of oxidation S3 of the high oxide region 20hox have a relation of S2<S1<S3 within a range in which the oxide semiconductor layer 20sl has predetermined electric resistance. This can stabilize the threshold voltage while increasing the mobility and on-state current of the TFT 26.

In other words, in the oxide semiconductor layer 20sl, the degree of oxidation S1 of the portion located on the side of the gate insulating film 16 and the degree of oxidation S2 of the surface layer portions located in the connection regions with the source electrode 24sd and the drain electrode 24dd have a relation of S2<S1. Accordingly, in the surface layer portions of the oxide semiconductor layer 20sl which are located in the connection regions with the source electrode 24sd and the drain electrode 24dd, the electric resistance can be reduced according to the degrees of oxidation S2. This reduces the contact resistance between the oxide semiconductor layer 20sl and the source electrode 24sd and between the oxide semiconductor layer 20sl and the drain electrode 24dd, whereby the mobility and on-state current of the TFT 26 can be increased. Even if the source and drain electrodes are formed by dry etching, and a protective insulating film is formed by a vapor deposition method such as a CVD method, oxygen deficiency is compensated for and alteration is suppressed in the portion of the oxide semiconductor layer 20sl which is located on the side of the gate insulating film 16. Thus, higher electric resistance according to the degree of oxidation S1 can be ensured in the portion of the oxide semiconductor layer 20sl which is located on the side of the gate insulating film 16 than in the surface layer portions of the oxide semiconductor layer 20sl which are located in the connection regions with the source and drain electrodes. In the oxide semiconductor layer 20sl, oxygen deficiency tends to occur particularly in the surface layer portion of the channel region 20c (the high oxide region 20hox). Since the degree of oxidation S3 of this surface layer portion is higher than the degrees of oxidation S1, S2 of the other regions, higher electric resistance according to the degree of oxidation S3 can be ensured in the surface layer portion of the channel region 20c than in the other regions. This can stabilize the threshold voltage of the TFT 26.

Manufacturing Method

Figure 19:
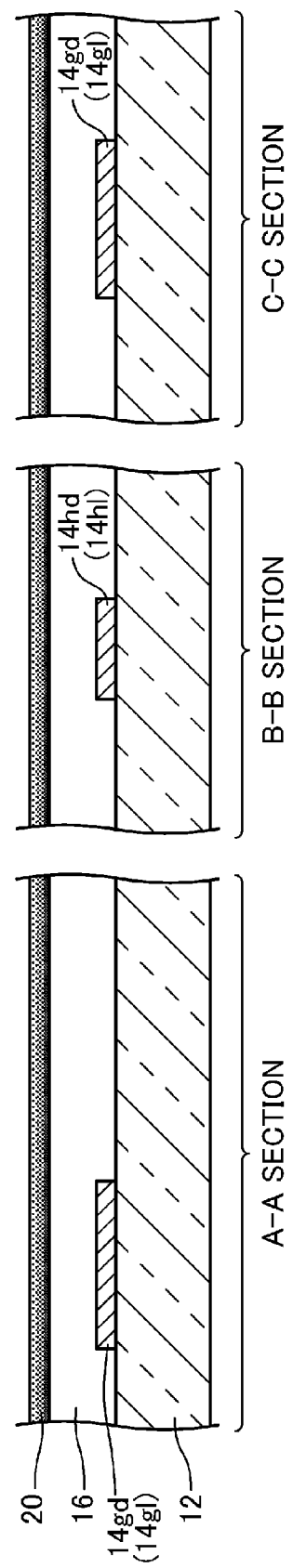
FIG. 19 is a cross-sectional view corresponding to FIG. 18, showing the state where an oxide semiconductor film has been formed in a second patterning step in a manufacturing method of the TFT substrate according to the third embodiment.
Figure 20:
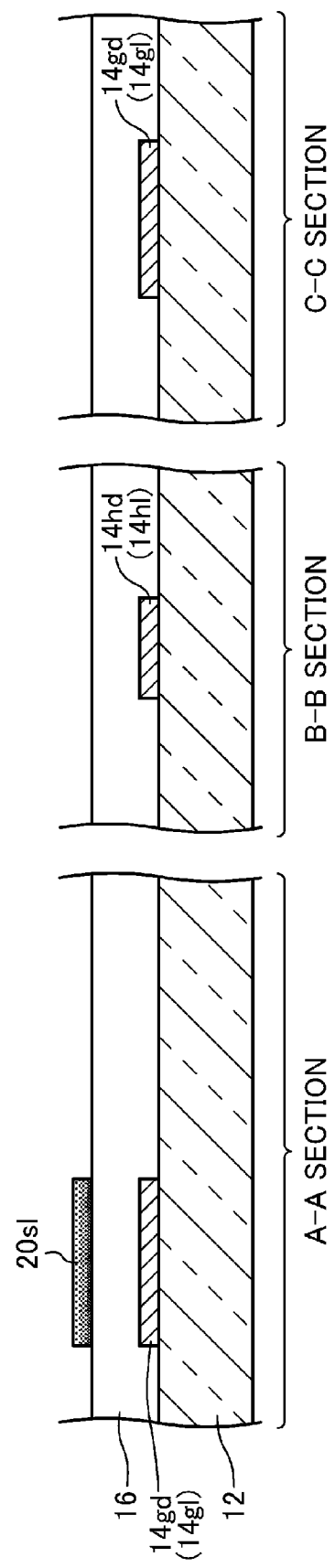
FIG. 20 is a cross-sectional view corresponding to FIG. 18, showing the state where an oxide semiconductor layer has been formed in the second patterning step in the manufacturing method of the TFT substrate according to the third embodiment.
Figure 21:
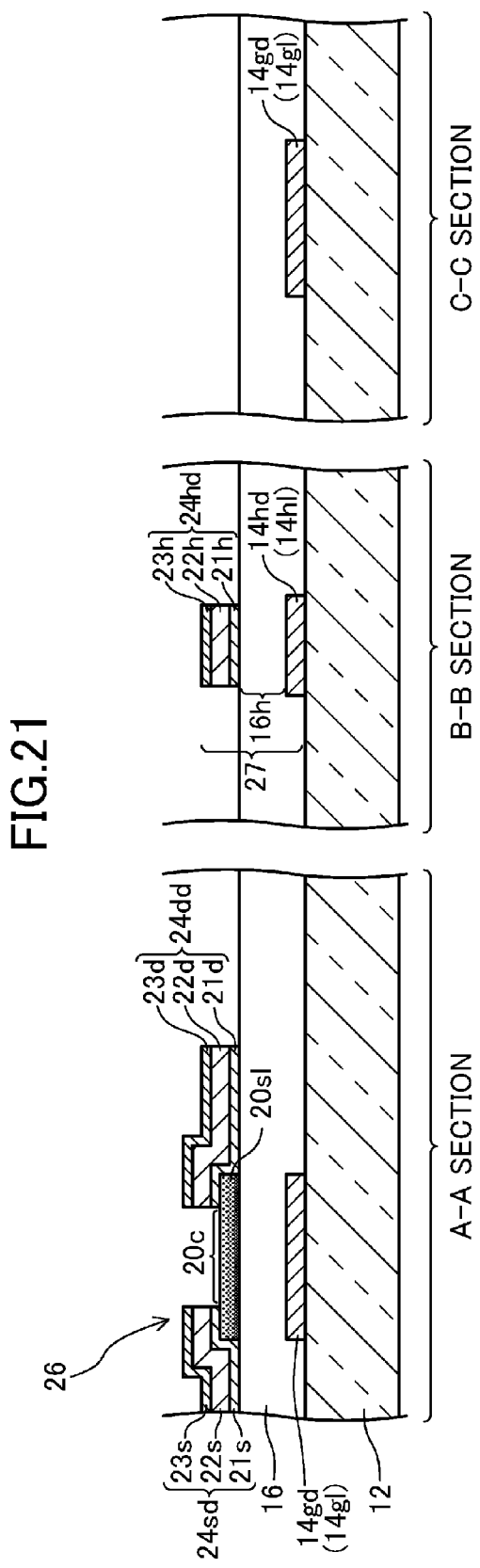
FIG. 21 is a cross-sectional view corresponding to FIG. 18, showing the state where a source electrode and a drain electrode have been formed in a third patterning step in the manufacturing method of the TFT substrate according to the third embodiment.
Figure 22:
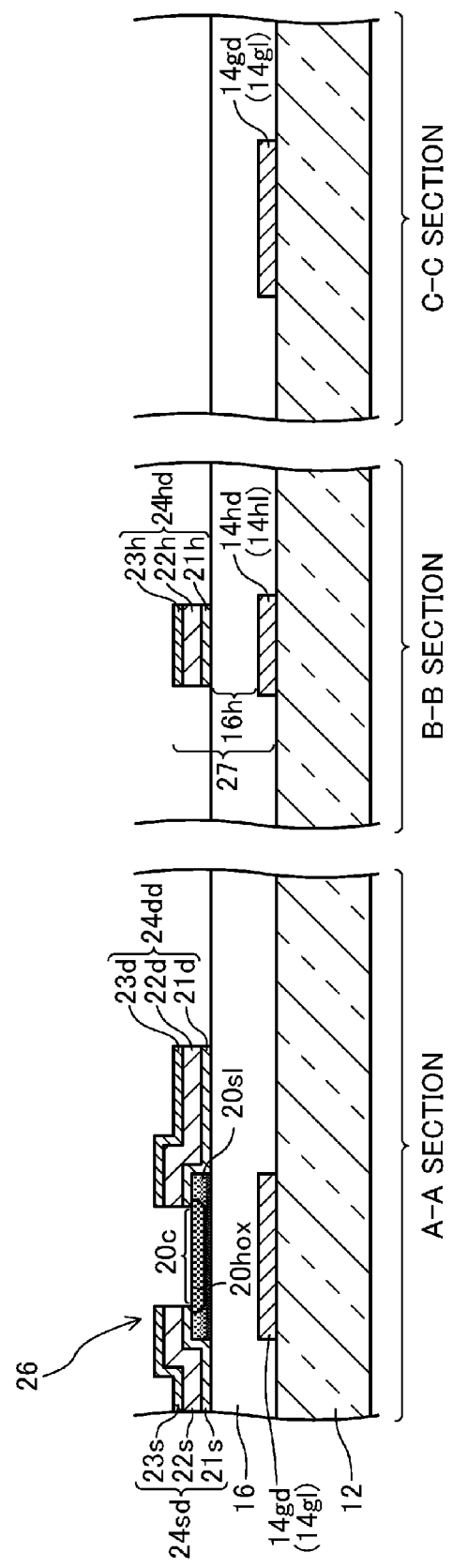
FIG. 22 is a cross-sectional view corresponding to FIG. 18, showing the state where the oxide semiconductor layer has been annealed in the manufacturing method of the TFT substrate according to the third embodiment.
Figure 23:
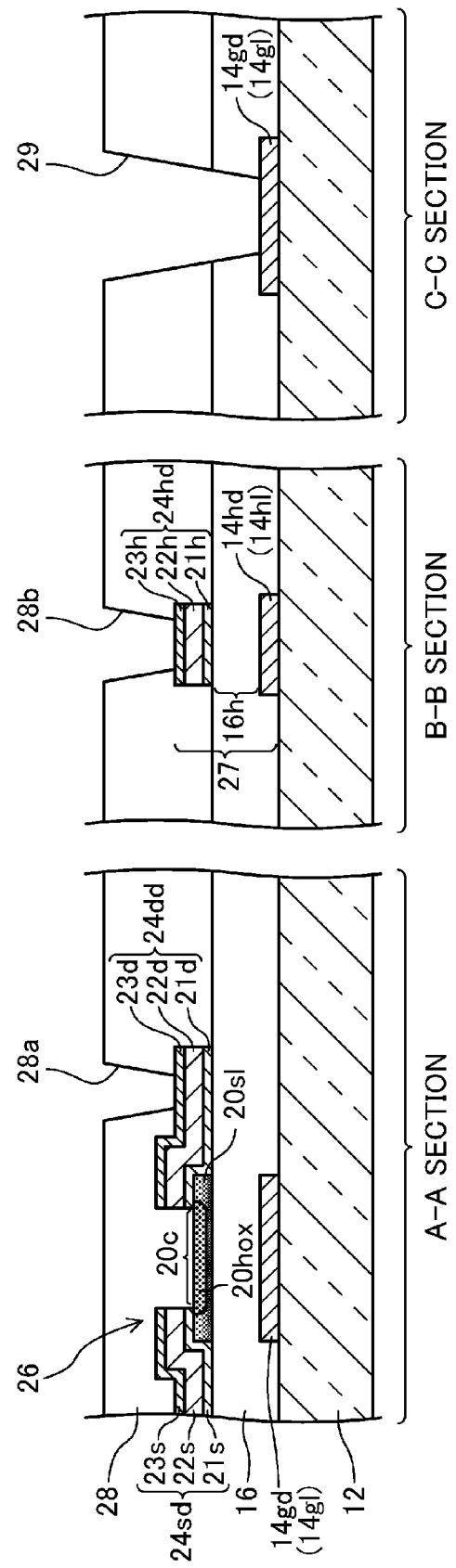
FIG. 23 is a cross-sectional view corresponding to FIG. 18, showing the state where a protective insulating film has been formed in a fourth patterning step in the manufacturing method of the TFT substrate according to the third embodiment.

A method for manufacturing the TFT substrate 10 will be described below with reference to FIGS. 19-23. FIGS. 19 and 20 are cross-sectional views showing a second patterning step. FIG. 21 is a cross-sectional view showing a third patterning step. FIG. 22 is a cross-sectional view showing the substrate state after annealing. FIG. 23 is a cross-sectional view showing a fourth patterning step. FIGS. 19-23 show the regions corresponding to FIG. 18.

A TFT substrate manufacturing step of the present embodiment also includes a first patterning step, a gate insulating film formation step, and second to fifth patterning steps. Since the first patterning step and the gate insulating film formation step are similar to those of the first embodiment, description thereof will be omitted.

(Second Patterning Step)

An oxide semiconductor film 20, which is comprised of an In—Ga—Zn—O-based oxide semiconductor, is formed by a sputtering method on a substrate having a gate insulating film 16 so that the degree of oxidation gradually decreases from the side of the gate insulating film 16 to the side of the surface layer. Specifically, the oxide semiconductor film 20 is formed with a thickness of about 30 nm to 150 nm by, e.g., using oxides containing indium (In), gallium (Ga), and zinc (Zn) ($In_2O_3:Ga_2O_3:ZnO=1:1:1$) as a target in a mixed gas atmosphere of argon (Ar) and oxygen ($O_2$), at a total flow rate of the mixed gas in the range of 200 sccm to 400 sccm, a chamber vacuum degree of about 0.1 Pa to 2.0 Pa, and DC power of about 3 kW to 20 kW. The oxygen gas is mixed in the range of 0 sccm to 100 sccm so that the flow rate of the oxygen gas gradually decreases as formation of the oxide semiconductor film 20 proceeds.

Then, a resist pattern is formed on the oxide semiconductor film 20 by photolithography using a second photomask, and wet etching using an oxalic acid solution is performed on the oxide semiconductor film 20 by using the resist pattern as a mask. Subsequently, delamination of the resist pattern and cleaning are performed by using a resist delamination solution, whereby an oxide semiconductor layer 20sl is formed as shown in FIG. 20.

(Third Patterning Step)

As in the first embodiment, a titanium (Ti) film, an aluminum (Al) film, and a molybdenum nitride (MoN) film are sequentially formed on the substrate having the oxide semiconductor layer 20sl, thereby forming a stacked conductive film. Then, by photolithography using a third photomask, the upper two layers of the stacked conductive film, namely the aluminum film and the molybdenum nitride film, are patterned by wet etching, and the remaining titanium film is patterned by RIE to simultaneously form a source line 24sl, a source electrode 24sd, a drain electrode 24dd, and an upper electrode 24hd, as shown in FIG. 21, thereby forming a TFT 26 and a storage capacitor 27.

Thereafter, the substrate having the source electrode 24sd and the drain electrode 24dd is subjected to water vapor annealing in a water vapor anneal chamber. This water vapor annealing is performed for, e.g., 10 to 180 minutes at about 100° C. to 450° C. at an atmospheric pressure in an atmosphere containing oxygen and water vapor by using an oxygen gas as a carrier gas. This annealing causes an oxidation reaction in the oxide semiconductor layer 20sl from the surface layer of the channel region 20c exposed from the source electrode 24sd and the drain electrode 24dd, whereby a high oxide region 20hox is formed as shown in FIG. 22.

(Fourth Patterning Step)

As in the first embodiment, a silicon oxide film is formed by a CVD method on the substrate having the source electrode 24sd, the drain electrode 24dd, etc., thereby forming a protective insulating film 28. Then, a resist pattern is formed by photolithography using a fourth photomask. By using the resist pattern as a mask, the protective insulating film 28 is patterned by RIE, thereby forming contact holes 28a, 28b, 28c, 29 in the protective insulating film 28, as shown in FIG. 23.

(Fifth Patterning Step)

As in the first embodiment, a transparent conductive film is formed by a sputtering method on the substrate having the contact holes 28a, 28b, 28c, 29 in the protective insulating film 28. A resist pattern is formed by photolithography using a fifth photomask. By using the resist pattern as a mask, the transparent conductive film is patterned by wet etching, thereby forming a pixel electrode 30pd, a gate connection electrode 30gt, and a source connection electrode 30st.

The TFT substrate 10 shown in FIG. 19 can be manufactured in this manner.

Advantages of Third Embodiment

According to the third embodiment as well, the threshold voltage is stabilized while increasing the mobility and on-state current of the channel etch TFT 26 using the oxide semiconductor layer 20sl, whereby satisfactory characteristics can be stably ensured. As a result, display quality can be improved while reducing manufacturing cost of the TFT substrate 10 and the LCD device S.

Fourth Embodiment of Invention

Figure 24:
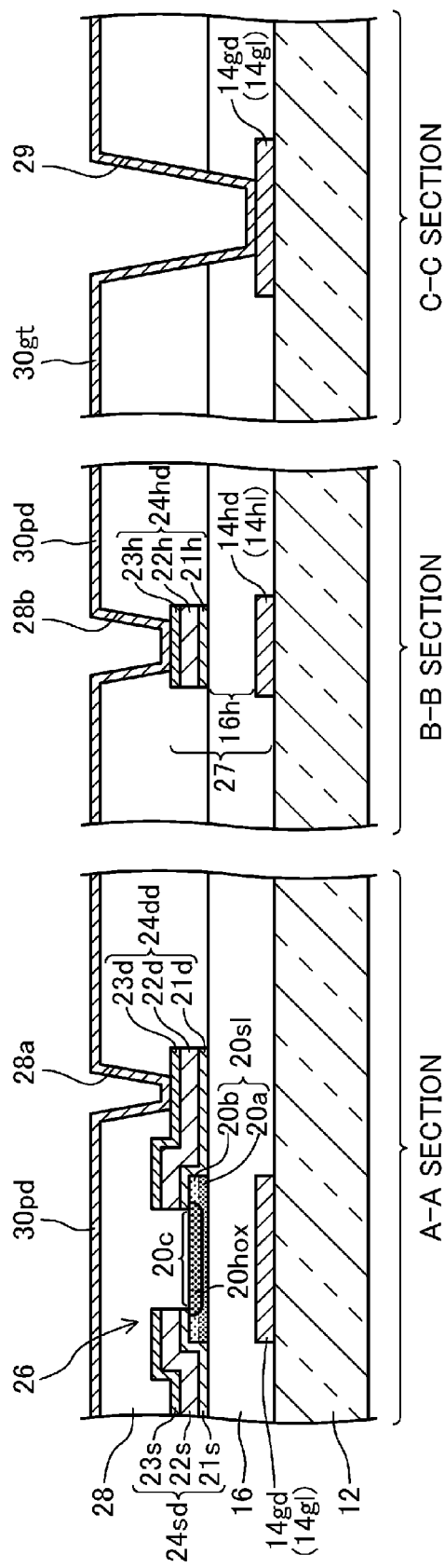
FIG. 24 is a cross-sectional view corresponding to FIG. 4, schematically showing a configuration of a pixel and terminal portions of interconnects in a TFT substrate according to a fourth embodiment.

FIG. 24 is a plan view showing a schematic configuration of a pixel and terminal portions of interconnects in a TFT substrate 10 according to a fourth embodiment.

In the third embodiment, the oxide semiconductor layer 20sl in the TFT 26 is formed by a single layer, and in the oxide semiconductor layer 20sl except the surface layer portion of the channel region 20c, the degree of oxidation gradually decreases from the side of the gate insulating film 16 to the side of the source electrode 24sd and the drain electrode 24dd. However, an oxide semiconductor layer 20sl of the present embodiment is formed by a single layer that has a first region 20a located on the side of the gate insulating film 16 and having a relatively high degree of oxidation, and a second region 20b located on the side of the surface layer in the connection regions with the source electrode 24s and the drain electrode 24dd and having a relatively low degree of oxidation.

A high oxide region 20hox having a higher degree of oxidation than the other regions 20a, 20b is formed in the surface layer portion of the channel region 20c in the oxide semiconductor layer 20sl. As in the first embodiment, this high oxide region 20hox is formed by annealing the oxide semiconductor layer 20sl in an oxygen-containing atmosphere after formation of the source electrode 24sd and the drain electrode 24dd. The high oxide region 20hox slightly extends in the connection regions with the source electrode 24sd and the drain electrode 24dd, and in the first region 20a.

As described above, in the oxide semiconductor layer 20sl of the present embodiment, the degree of oxidation S1 of the first region 20a, the degree of oxidation S2 of the second region 20b, and the degree of oxidation S3 of the high oxide region 20hox have a relation of S2<S1<S3 within a range in which the oxide semiconductor layer 20sl has predetermined electric resistance. This can stabilize the threshold voltage while increasing the mobility and on-state current of the TFT 26.

In other words, in the oxide semiconductor layer 20sl, the degree of oxidation S1 of the first region 20a and the degree of oxidation S2 of the second region 20b have a relation of S2<S1. Accordingly, in the surface layer portions of the oxide semiconductor layer 20sl which are located in the connection regions with the source electrode 24sd and the drain electrode 24dd, the electric resistance can be reduced according to the degrees of oxidation S2. This reduces the contact resistance between the oxide semiconductor layer 20sl and the source electrode 24sd and between the oxide semiconductor layer 20sl and the drain electrode 24dd, whereby the mobility and on-state current of the TFT 26 can be increased. Even if the source and drain electrodes are formed by dry etching, and a protective insulating film is formed by a vapor deposition method such as a CVD method, oxygen deficiency is compensated for and alteration is suppressed in the portion of the oxide semiconductor layer 20sl which is located on the side of the gate insulating film 16. Thus, higher electric resistance according to the degree of oxidation S1 can be ensured in the portion of the oxide semiconductor layer 20sl which is located on the side of the gate insulating film 16 than in the second region 20b. In the oxide semiconductor layer 20sl, oxygen deficiency tends to occur particularly in the surface layer portion of the channel region 20c (the high oxide region 20hox). Since the degree of oxidation S3 of this surface layer portion is higher than the degrees of oxidation S1, S2 of the other regions 20a, 20b, higher electric resistance according to the degree of oxidation S3 can be ensured in the surface layer portion of the channel region 20c than in the other regions 20a, 20b. This can stabilize the threshold voltage of the TFT 26.

Manufacturing Method

Figure 25:
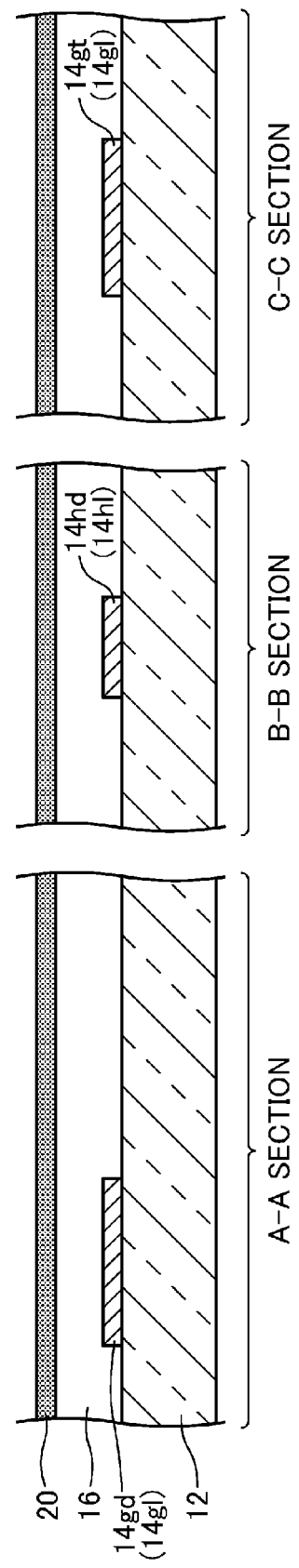
FIG. 25 is a cross-sectional view corresponding to FIG. 24, showing the state where an oxide semiconductor film has been formed in a second patterning step in a manufacturing method of the TFT substrate according to the fourth embodiment.
Figure 26:
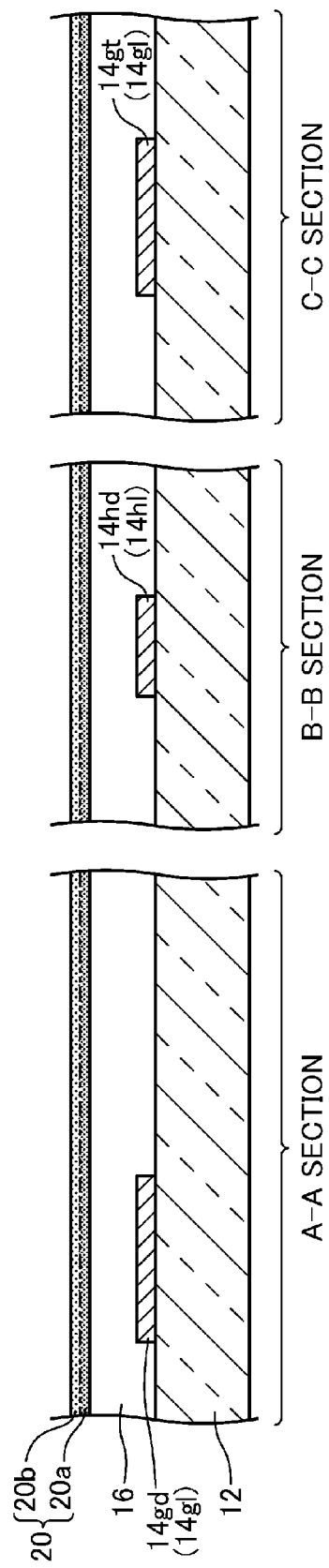
FIG. 26 is a cross-sectional view corresponding to FIG. 24, showing the state where the oxide semiconductor film has been subjected to a plasma treatment in the second patterning step in the manufacturing method of the TFT substrate according to the fourth embodiment.
Figure 27:
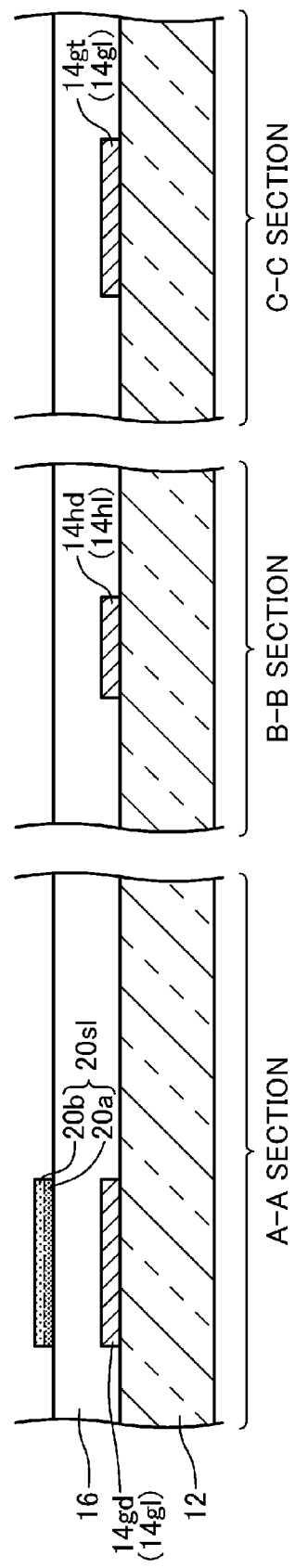
FIG. 27 is a cross-sectional view corresponding to FIG. 24, showing the state where an oxide semiconductor layer has been formed in the second patterning step in the manufacturing method of the TFT substrate according to the fourth embodiment.
Figure 28:
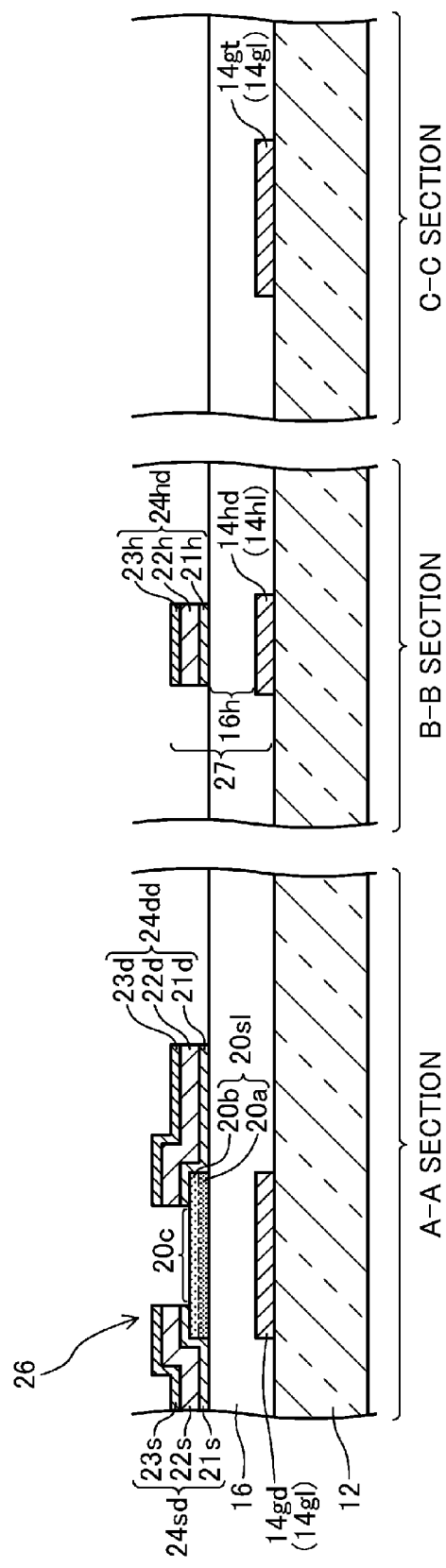
FIG. 28 is a cross-sectional view corresponding to FIG. 24, showing the state where a source electrode and a drain electrode have been formed in a third patterning step in the manufacturing method of the TFT substrate according to the fourth embodiment.

A method for manufacturing the TFT substrate 10 will be described below with reference to FIGS. 25-30. FIGS. 25-27 are cross-sectional views showing a second patterning step. FIG. 28 is a cross-sectional view showing a third patterning step. FIG. 29 is a cross-sectional view showing the substrate state after annealing. FIG. 30 is a cross-sectional view showing a fourth patterning step. FIGS. 25-30 show the regions corresponding to FIG. 24.

A TFT substrate manufacturing step of the present embodiment also includes a first patterning step, a gate insulating film formation step, and second to fifth patterning steps. Since the first patterning step and the gate insulating film formation step are similar to those of the first embodiment, description thereof will be omitted.

(Second Patterning Step)

As show in FIG. 25, an oxide semiconductor film 20, which is comprised of an In—Ga—Zn—O-based oxide semiconductor, is formed by a sputtering method on a substrate having a gate insulating film 16. Specifically, the oxide semiconductor film 20 is formed with a thickness of about 30 nm to 100 nm by, e.g., using oxides containing indium (In), gallium (Ga), and zinc (Zn) ($In_2O_3:Ga_2O_3:ZnO=1:1:1$) as a target in a mixed gas atmosphere of argon (Ar) and oxygen ($O_2$), at a total flow rate of the mixed gas in the range of 200 sccm to 400 sccm with a flow rate of the oxide gas in the range of 5 sccm to 60 sccm, a chamber vacuum degree of about 0.1 Pa to 2.0 Pa, and DC power of about 3 kW to 20 kW.

Then, the oxide semiconductor film 20 is subjected to a hydrogen plasma treatment by using a CVD apparatus. This hydrogen plasma treatment is performed for 100 to 300 seconds at a hydrogen gas flow rate of 200 sccm to 3,000 sccm, a chamber vacuum degree of about 100 Pa to 300 Pa, and high frequency power of about 5 W to 3,000 W. The degree of oxidation of the surface layer of the oxide semiconductor film 20 is reduced by a reduction reaction in the hydrogen plasma treatment, thereby dividing the oxide semiconductor film 20 into a first region 20a having a relatively high degree of oxidation and a second region 20b having a relatively low degree of oxidation, as shown in FIG. 26.

Thereafter, a resist pattern is formed on the oxide semiconductor film 20 by photolithography using a second photomask, and wet etching using an oxalic acid solution is performed on the oxide semiconductor film 20 by using the resist pattern as a mask. Subsequently, delamination of the resist pattern and cleaning are performed by using a resist delamination solution, whereby an oxide semiconductor layer 20sl is formed as shown in FIG. 27.

(Third Patterning Step)

As in the first embodiment, a titanium (Ti) film, an aluminum (Al) film, and a molybdenum nitride (MoN) film are sequentially formed on the substrate having the oxide semiconductor layer 20sl, thereby forming a stacked conductive film. Then, by photolithography using a third photomask, the upper two layers of the stacked conductive film, namely the aluminum film and the molybdenum nitride film, are patterned by wet etching, and the remaining titanium film is patterned by RIE to simultaneously form a source line 24sl, a source electrode 24sd, a drain electrode 24dd, and an upper electrode 24hd, as shown in FIG. 28, thereby forming a TFT 26 and a storage capacitor 27.

Thereafter, the substrate having the source electrode 24sd and the drain electrode 24dd is subjected to water vapor annealing in a water vapor anneal chamber. This water vapor annealing is performed for, e.g., 10 to 180 minutes at about 100° C. to 450° C. at an atmospheric pressure in an atmosphere containing oxygen and water vapor by using an oxygen gas as a carrier gas. This annealing causes an oxidation reaction in the oxide semiconductor layer 20sl from the surface layer of the channel region 20c exposed from the source electrode 24sd and the drain electrode 24dd, whereby a high oxide region 20hox is formed as shown in FIG. 29.

(Fourth Patterning Step)

As in the first embodiment, a silicon oxide film is formed by a CVD method on the substrate having the source electrode 24sd, the drain electrode 24dd, etc., thereby forming a protective insulating film 28. Then, a resist pattern is formed by photolithography using a fourth photomask. By using the resist pattern as a mask, the protective insulating film 28 is patterned by RIE, thereby forming contact holes 28a, 28b, 28c, 29 in the protective insulating film 28, as shown in FIG. 30.

(Fifth Patterning Step)

As in the first embodiment, a transparent conductive film is formed by a sputtering method on the substrate having the contact holes 28a, 28b, 28c, 29 in the protective insulating film 28. A resist pattern is formed by photolithography using a fifth photomask. By using the resist pattern as a mask, the transparent conductive film is patterned by wet etching, thereby forming a pixel electrode 30pd, a gate connection electrode 30gt, and a source connection electrode 30st.

The TFT substrate 10 shown in FIG. 24 can be manufactured in this manner.

Advantages of Fourth Embodiment

According to the fourth embodiment as well, the threshold voltage is stabilized while increasing the mobility and on-state current of the channel etch TFT 26 using the oxide semiconductor layer 20sl, whereby satisfactory characteristics can be stably ensured. As a result, display quality can be improved while reducing manufacturing cost of the TFT substrate 10 and the LCD device S.

Other Embodiments

In the first to fourth embodiments, the water vapor annealing is performed between formation of the source electrode 24sd and the drain electrode 24dd and formation of the protective insulating film 28. However, the present invention is not limited to this, and the water vapor annealing may be performed after formation of the protective insulating film 28.

Oxygen deficiency may occur due to elimination of oxygen from the channel region 20c of the oxide semiconductor layer 20sl when forming the protective insulating film 28 by a CVD method. However, since the annealing is performed in an oxygen atmosphere after formation of the protective insulating film 28, the oxygen deficiency in the oxide semiconductor layer 20sl can be effectively made up, and characteristics of the oxide semiconductor layer 20sl can be reliably stabilized.

In this case, the protective insulating film 28 is preferably comprised of silicon oxide (SiO). With this configuration, since the protective insulating film 28 comprised of silicon oxide typically has a higher oxygen transmission rate than, e.g., a silicon nitride film, oxygen of the annealing can be effectively supplied to the channel region 20c of the oxide semiconductor layer 20sl.

The oxide semiconductor layer 20sl has a two-layer structure in the first embodiment, and a three-layer structure in the second embodiment. However, the present invention is not limited to this, and the oxide semiconductor layer 20sl may have a four or more layer structure if, in the oxide semiconductor layer 20sl, the degree of oxidation S1 of the portion located on the side of the gate insulating film and the degree of oxidation S2 of the surface layer portions located in the connection regions with the source electrode 24sd and the drain electrode 24dd have a relation of S2<S1 within a range in which the oxide semiconductor layer 20sl has predetermined electric resistance, and the degree of oxidation S3 of the surface layer portion of the channel region 20c is higher than the degrees of oxidation S1, S2 of the other regions within the range in which the oxide semiconductor layer has the predetermined electric resistance.

Although the preferred embodiments of the present invention are described above, the technical scope of the present invention is not limited to that described in the above embodiments. It should be understood by those skilled in the art that the above embodiments are by way of illustration only, and various modifications can be made to the combinations of the components and the processes, and such modifications are within the scope of the present invention.

For example, in the above embodiments, the oxide semiconductor layer 20sl is comprised of an In—Ga—Zn—O-based oxide semiconductor. However, the present invention is not limited to this, and the oxide semiconductor layer 20sl may be comprised of other oxide semiconductors such as indium silicon zinc oxide (In—Si—Zn—O)-based, indium aluminum zinc oxide (In—Al—Zn—O)-based, tin silicon zinc oxide (Sn—Si—Zn—O)-based, tin aluminum zinc oxide (Sn—Al—Zn—O)-based, tin gallium zinc oxide (Sn—Ga—Zn—O)-based, gallium silicon zinc oxide (Ga—Si—Zn—O)-based, gallium aluminum zinc oxide (Ga—Al—Zn—O)-based, indium copper zinc oxide (In—Cu—Zn—O)-based, tin copper zinc oxide (Sn—Cu—Zn—O)-based, tin oxide (Sn—O)-based, and indium oxide (In—O)-based oxide semiconductors.

The LCD device S is described as an example in the above embodiments. However, the present invention is not limited to this, and the present invention is applicable not only to the LCD device S but also to other display devices such as an organic electroluminescence (EL) display device and a plasma display device, and is widely applicable to any electronic equipment having TFTs.

INDUSTRIAL APPLICABILITY

As described above, the present invention is useful for TFT substrates, LCD devices including the TFT substrate, and manufacturing methods of the TFT substrate, and is particularly suitable for TFT substrates in which it is desired that satisfactory characteristics be stably ensured in channel etch TFTs using an oxide semiconductor layer, LCD devices including such a TFT substrate, and manufacturing methods of the TFT substrate.

DESCRIPTION OF REFERENCE CHARACTERS

S LCD Device
12 Insulating Substrate (Base Substrate)
14gd Gate Electrode
16 Gate Insulating Film
17s First Semiconductor Layer
18s Second Semiconductor Layer
19s Third Semiconductor Layer
20 Stacked Semiconductor Film, Oxide Semiconductor Film
20sl Oxide Semiconductor Layer
20c Channel Region
24sd Source Electrode
24dd Drain Electrode
26 TFT (Thin Film Transistor)
28 Protective Insulating Film
30pd Pixel Electrode
50 Counter Substrate
52 Liquid Crystal Layer

The invention claimed is:

1. A thin film transistor substrate, comprising:
a base substrate; and
a plurality of thin film transistors provided on the base substrate;
a protective insulating film provided so as to cover the thin film transistors; and
a plurality of pixel electrodes provided on the protective insulating film so as to correspond to the thin film transistors, respectively, wherein
each of the thin film transistors includes a gate electrode, a gate insulating film provided so as to cover the gate electrode, a semiconductor layer made of an oxide semiconductor and provided on the gate insulating film so as to overlap the gate electrode, and a source electrode and a drain electrode which are provided on the gate insulating film so as to be separated from each other on the semiconductor layer and so that a portion of the source electrode and a portion of the drain electrode are connected to the semiconductor layer,
a channel region is provided in a portion of the semiconductor layer which is located between the source electrode and the drain electrode,
a ratio of oxygen to all metal elements of a first portion of the semiconductor layer located at a lower surface of the semiconductor layer which is arranged directly on the gate insulating film is S1,
a ratio of oxygen to all metal elements of second portions of the semiconductor layer located at an upper surface of the semiconductor layer at connection regions with the source and drain electrodes is S2, where S2<S1,
a ratio of oxygen to all metal elements of a third portion located at the upper surface portion of the semiconductor layer between the second portions is S3, where S1<S3 and S2<S3,
the first portion is located between the second portions and the gate insulating film in a vertical direction at positions overlapping with the source and drain electrodes when seen from a top plan view, and
the first portion is located between the third portion and the gate insulating film in the vertical direction at a position overlapping with the channel region in the top plan view.

2. The thin film transistor substrate of claim 1, wherein the semiconductor layer has a stacked structure formed by stacking a plurality of layers.

3. The thin film transistor substrate of claim 2, wherein the semiconductor layer has a two-layer structure defined by sequentially stacking a first semiconductor layer and a second semiconductor layer, and in the semiconductor layer, a portion located adjacent to the gate insulating film corresponds to the first semiconductor layer, the second portions are in contact with the source and drain electrodes and correspond to portions of the second semiconductor layer which are in contact with the source and drain electrodes, and the third portion of the channel region corresponds to a channel region portion of the second semiconductor layer.

4. The thin film transistor substrate of claim 2, wherein the semiconductor layer has a three-layer structure defined by sequentially stacking a first semiconductor layer, a second semiconductor layer, and a third semiconductor layer, and in the semiconductor layer, a portion located adjacent to the gate insulating film corresponds to the first semiconductor layer, the second portions are located in contact with the source and drain electrodes and correspond to portions of the second semiconductor layer and the third semiconductor layer which are located in contact with the source and drain electrodes, and the third portion of the channel region corresponds to channel region portions of the second semiconductor layer and the third semiconductor layer.

5. The thin film transistor substrate of claim 1, wherein the semiconductor layer is defined by a single layer, and in all portions of the semiconductor layer except for the third portion of the channel region, the ratio of oxygen to all metal elements decreases from the gate insulating film to the source electrode and the drain electrode.

6. The thin film transistor substrate of claim 1, wherein at least a surface layer portion of the gate insulating film is comprised of silicon oxide.

7. The thin film transistor substrate of claim 1, wherein the protective insulating film is comprised of silicon oxide.

8. The thin film transistor substrate of claim 1, wherein the semiconductor layer is comprised of an indium gallium zinc oxide-based oxide semiconductor.

9. A liquid crystal display device, comprising:
the thin film transistor substrate of claim 1;
a counter substrate placed so as to face the thin film transistor substrate; and
a liquid crystal layer provided between the thin film transistor substrate and the counter substrate.

10. A method for manufacturing the thin film transistor substrate of claim 1, comprising:
a first patterning step of forming the gate electrode by forming a conductive film on the base substrate and patterning the conductive film by using a first photomask;
a gate insulating film formation step of forming the gate insulating film so as to cover the gate electrode;
a second patterning step of forming the semiconductor layer of the thin film transistor by forming on the gate insulating film a semiconductor film comprised of an oxide semiconductor so as to have the relation of $S2<S1$, and patterning the semiconductor film by using a second photomask;
a third patterning step of forming the source electrode and the drain electrode by forming a conductive film so as to cover the semiconductor layer and patterning the conductive film by dry etching using a third photomask;
a fourth patterning step of forming a contact hole in a region corresponding to the drain electrode by forming a protective insulating film by a vapor deposition method so as to cover the source electrode and the drain electrode and patterning the protective insulating film by using a fourth photomask; and
a fifth patterning step of forming the pixel electrode so as to connect to the drain electrode, by forming on the protective insulating film a conductive film so as to connect to the drain electrode via the contact hole, and patterning the conductive film by using a fifth photomask, wherein
in the semiconductor layer, $S3$ is made higher than $S1$ and $S2$ by annealing the substrate having both the source electrode and the drain electrode formed thereon in an oxygen-containing atmosphere after the third patterning step.

* * * * *